US012761270B2

(12) United States Patent
Hitomi et al.

(10) Patent No.: US 12,761,270 B2
(45) Date of Patent: Oct. 13, 2026

(54) WAFER AND PROBER

(71) Applicant: Kioxia Corporation, Tokyo (JP)

(72) Inventors: Tatsuro Hitomi, Hiratsuka Kanagawa (JP); Yasuhito Yoshimizu, Kawasaki Kanagawa (JP); Masayuki Miura, Tokyo (JP); Arata Inoue, Chigasaki Kanagawa (JP); Hiroyuki Dohmae, Yokohama Kanagawa (JP); Koichi Nakazawa, Yokkaichi Mie (JP); Mitoshi Miyaoka, Yokkaichi Mie (JP); Kazuhito Hayasaka, Tokyo (JP); Tomoya Sanuki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 270 days.

(21) Appl. No.: 18/209,398

(22) Filed: Jun. 13, 2023

(65) Prior Publication Data

US 2023/0324455 A1 Oct. 12, 2023

Related U.S. Application Data

(63) Continuation of application No. PCT/JP2021/009072, filed on Mar. 8, 2021.

(51) Int. Cl.
*G01R 31/28* (2006.01)
*G01R 1/073* (2006.01)

(52) U.S. Cl.
CPC ..... *G01R 31/2886* (2013.01); *G01R 1/07342* (2013.01)

(58) Field of Classification Search
CPC .............. G01R 1/2886; G01R 1/07342; G01R 1/07314; G01R 31/2891; G11C 29/006; G11C 2029/5602; G11C 29/56016; H01L 21/02; H01L 22/00
See application file for complete search history.

(56) References Cited

U.S. PATENT DOCUMENTS

| | | | |
|---|---|---|---|
| 6,744,067 | B1 | 6/2004 | Farnworth et al. |
| 7,777,511 | B2 | 8/2010 | Hagihara |
| 8,598,902 | B2 | 12/2013 | Umemura et al. |
| 11,422,712 | B2 | 8/2022 | Yoshimizu et al. |
| 2001/0042901 | A1 | 11/2001 | Maruyama |
| 2002/0186032 | A1 | 12/2002 | Okabe |

(Continued)

FOREIGN PATENT DOCUMENTS

| | | | |
|---|---|---|---|
| JP | 2000-269278 | A | 9/2000 |
| JP | 2009-130114 | A | 6/2009 |

(Continued)

*Primary Examiner* — Feba Pothen
(74) *Attorney, Agent, or Firm* — Maier & Maier, PLLC

(57) ABSTRACT

According to one embodiment, a wafer includes a substrate including a first region and a second region that do not overlap each other; a first chip unit and a second chip unit each arranged on the substrate; a first electrode and a second electrode each electrically connected to the first chip unit; and a third electrode and a fourth electrode each electrically connected to the second chip unit. The first electrode and the third electrode are arranged in the first region. The second electrode and the fourth electrode are arranged in the second region. The first region is independent of a region in which the first chip unit and the second chip unit are provided.

12 Claims, 27 Drawing Sheets

(56) References Cited

U.S. PATENT DOCUMENTS

| | | | | |
|---|---|---|---|---|
| 2003/0183931 | A1* | 10/2003 | Isobe | G01R 31/2884 257/734 |
| 2004/0140824 | A1* | 7/2004 | Ji | G01R 1/07342 324/754.07 |
| 2009/0121732 | A1 | 5/2009 | Crafts et al. | |
| 2009/0134894 | A1 | 5/2009 | Hagihara | |
| 2011/0234251 | A1 | 9/2011 | Komatsu et al. | |
| 2013/0015871 | A1 | 1/2013 | Cleary et al. | |
| 2015/0219688 | A1* | 8/2015 | Jeon | G01R 31/308 702/117 |
| 2022/0204270 | A1 | 6/2022 | Yoshimizu et al. | |
| 2022/0223552 | A1 | 7/2022 | Yoshimizu et al. | |

FOREIGN PATENT DOCUMENTS

| | | | |
|---|---|---|---|
| JP | 2015-049137 | A | 3/2015 |
| WO | 2010/064487 | A1 | 6/2010 |
| WO | 2021/095232 | A1 | 5/2021 |

* cited by examiner

| | | Conductivity | Contact resistance | Tolerance to abrasion | Tolerance to corrosion | Tolerance to oxidization | Tolerance to plastic deformation | Dust production |
|---|---|---|---|---|---|---|---|---|
| Structure | Porous | | | ◎ | | | ◎ | |
| | Wire | | | ◎ | | | ◎ | |
| | Spring | | | ◎ | | | ◎ | |
| | Ball | | | ◎ | | | ◎ | |
| Material | Conductive carbon | ◎ | ◎ | ◎ | | ◎ | ◎ | |
| | Conductive rubber | ◎ | ◎ | ◎ | ◎ | ◎ | ◎ | ◎ |
| | Mercury | ◎ | ◎ | ◎ | | ◎ | ◎ | |

FIG. 19

WAFER AND PROBER

CROSS-REFERENCE TO RELATED APPLICATIONS

This application is a Continuation application of PCT Application No. PCT/JP2021/009072, filed Mar. 8, 2021, the entire contents of which are incorporated herein by reference.

FIELD

Embodiments relate to a wafer and a prober.

BACKGROUND

A prober configured to electrically connect a wafer and a probe card has been known, where a plurality of chip units are provided on the wafer, and the probe card controls these chip units of the wafer.

BRIEF DESCRIPTION OF DRAWINGS

FIG. 19 is a diagram showing the properties of different exemplary configurations of electrodes that have been rearranged according to the third modification of the first embodiment.

DETAILED DESCRIPTION

Figure 1:
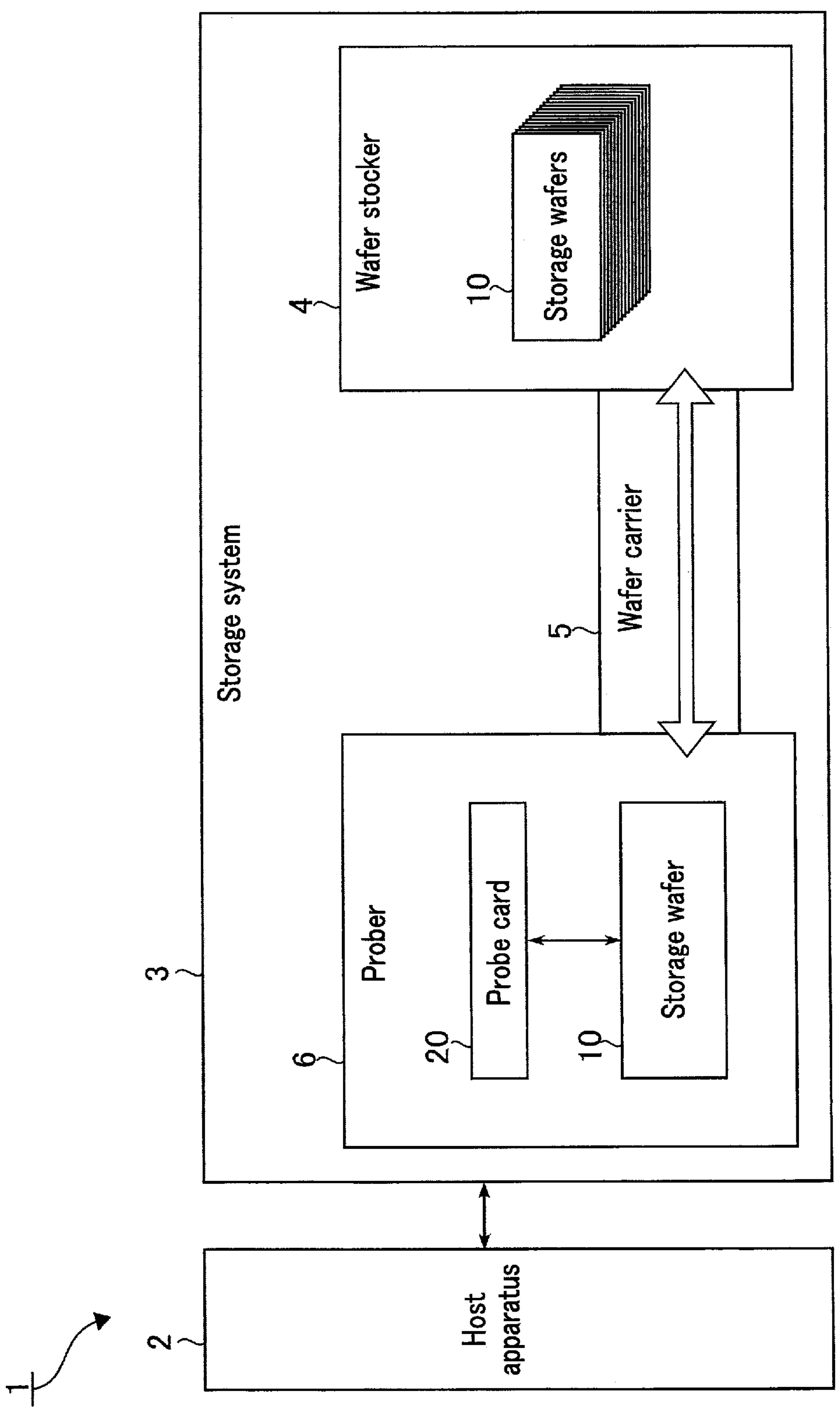
FIG. 1 is a block diagram illustrating a configuration of an information processing system according to a first embodiment.

According to one embodiment, a wafer includes a substrate including a first region and a second region that do not overlap each other; a first chip unit and a second chip unit each arranged on the substrate; a first electrode and a second electrode each electrically connected to the first chip unit; and a third electrode and a fourth electrode each electrically connected to the second chip unit. The first electrode and the third electrode are arranged in the first region. The second electrode and the fourth electrode are arranged in the second region. The first region is independent of a region in which the first chip unit and the second chip unit are provided.

Hereinafter, embodiments will be described with reference to the accompanying drawings. In the description below, the same reference symbol will be assigned to constituent elements having the same function and configuration. The elements with a common reference numeral or symbol are distinguished from each other by adding a suffix to the common reference numeral or symbol. If a plurality of elements do not need to be particularly distinguished from each other, only a common reference numeral or symbol will be provided, without a suffix added.

1. First Embodiment

A first embodiment will be described.

1.1. Configuration

1.1.1. Information Processing System

A configuration of a information system according to the first embodiment will be described. FIG. 1 is a block diagram showing a configuration of the information processing system according to the first embodiment. The information processing system 1 includes, as shown in FIG. 1, a host device 2, and a storage system 3.

The host device 2 is a data processing device that uses the storage system 3 to process data. The host device 2 may be a server in a data center.

The storage system 3 is a storage device connected to the host device 2. The storage system 3 may be a solid state drive (SSD) configured to access a wafer provided with memory devices. The storage system 3 executes data program processing and data read processing in response to a request (command) from the host device 2.

1.1.2. Storage System

Next, the internal configuration of the storage system according to the first embodiment will be described with reference to FIG. 1.

The storage system 3 includes a wafer stocker 4, a wafer carrier 5, a prober 6, a plurality of storage wafers 10, and a probe card 20.

The wafer stocker 4 stores a plurality of storage wafers 10 that have not yet been placed on the prober 6.

The wafer carrier 5 has a function of transferring the storage wafers 10 between the wafer stocker 4 and the prober 6.

A storage wafer 10 and the probe card 20 are placed on the prober 6. The prober 6 has a function of electrically connecting the storage wafer 10 to the probe card 20. The prober 6 also executes various kinds of control processing in order to establish an electrical connection between the storage wafer 10 and the probe card 20.

The storage wafer 10 is a wafer in which memory devices (not shown) having a data storage function are provided. The probe card 20 is a card substrate on the surface of which a memory controller (not shown) for controlling the storage wafer 10 is provided. With the control processing by the prober 6, the memory devices in the storage wafer 10 and the memory controller on the probe card 20 are physically and electrically connected to each other.

1.1.3. Prober

The internal configuration of the prober according to the first embodiment will be described next.

1.1.3.1. Communication Function

Figure 2:
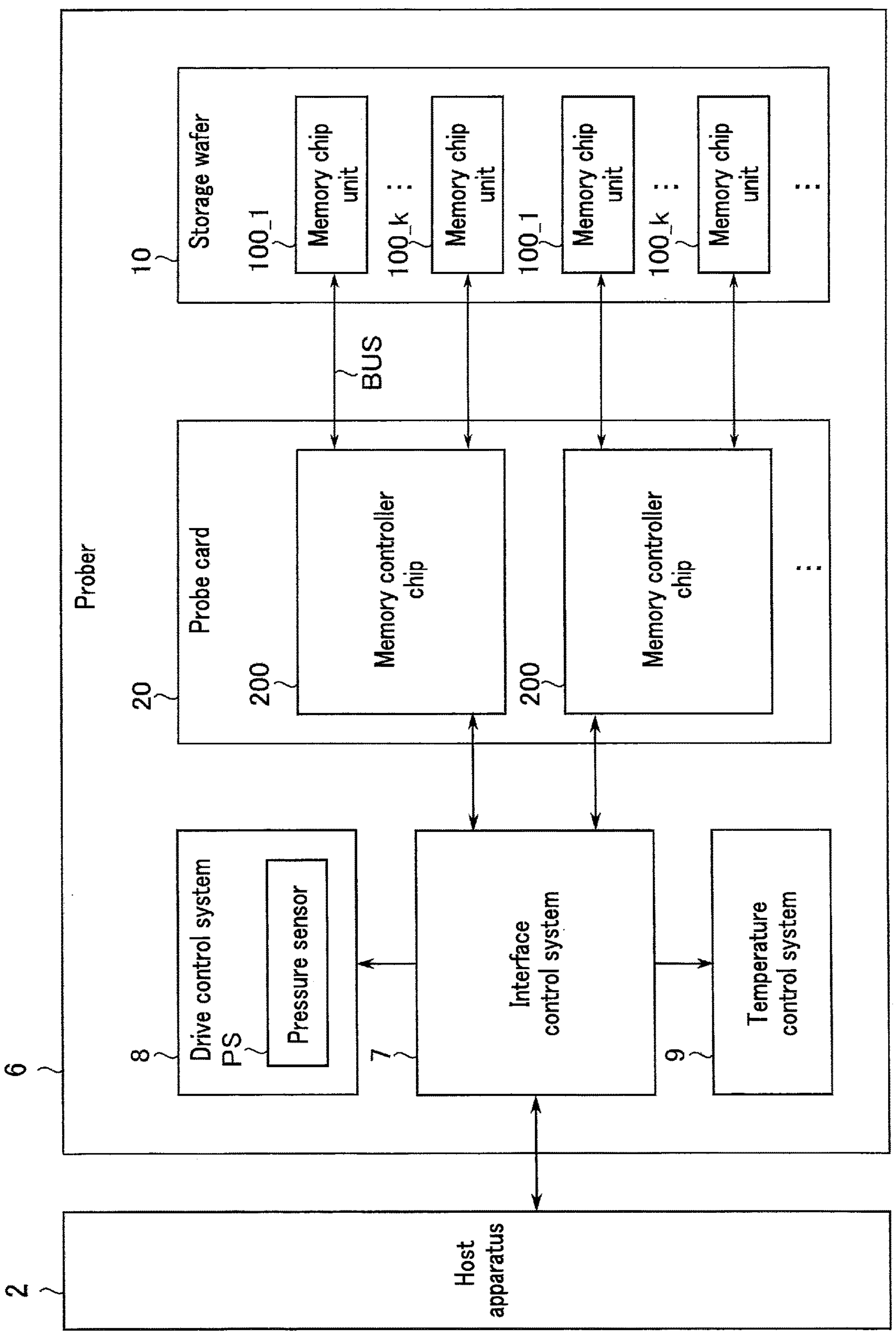
FIG. 2 is a block diagram showing a configuration of a host device and a prober according to the first embodiment.

The communication function of the prober according to the first embodiment will be described with reference to FIG. 2. A block diagram for an exemplary configuration of a host device and a prober according to the first embodiment is presented in FIG. 2, where an exemplary connection relationship of the storage wafer 10 and the probe card 20 physically and electrically connected in the prober 6 is illustrated. The prober 6 further includes an interface control system 7, a drive control system 8, and a temperature control system 9, as shown in FIG. 2. The storage wafer 10 includes a plurality of memory chip units 100. The probe card 20 includes a plurality of memory controller chips 200.

The interface control system 7 is a circuit for controlling the interface that relates to the data transmission mainly in the prober 6. For instance, the interface control system 7 transfers requests and data received from the host device 2 to the probe card 20. The interface control system 7 transfers the data received from the probe card 20 to the host device 2. The interface control system 7 is connected to the host device 2 via a host bus. The host bus conforms to, for example, the Peripheral Component Interconnect Express (PCIe™). When the storage wafer 10 and the probe card 20 are brought into contact with each other, the interface control system 7 performs various types of control upon the drive control system 8 and the temperature control system 9.

The drive control system 8 includes a torque mechanism configured to freely and three-dimensionally change the relative position between the storage wafer 10 and the probe card 20, and a control unit configured to control the torque mechanism (neither of them shown). The drive control system 8 has a function of, with the torque mechanism driven by the control unit, bringing the storage wafer 10 and the probe card 20 into contact with each other.

The drive control system 8 further includes a pressure sensor PS. The pressure sensor PS is configured to measure a two-dimensional distribution of a pressure produced when the storage wafer 10 and the probe card 20 are brought into contact with each other. The control unit of the drive control system 8 controls the output of the torque mechanism in such a manner that the two-dimensional distribution of the pressure measured by the pressure sensor PS satisfies a certain condition. The method of the drive control system 8 controlling the pressure of the torque mechanism using the pressure sensor PS will be described in detail later.

The temperature control system 9 controls a temperature environment to which the storage wafer 10 and the probe card 20 placed in the prober 6 are exposed. For instance, the temperature control system 9 is configured to keep the temperatures of the storage wafer 10 and the probe card 20 within a certain range based on the temperature measured by a temperature sensor (not shown).

Each of the memory controller chips 200 is configured by an integrated circuit such as a System-on-a-Chip (SoC), and has, for example, a field programmable gate array (FPGA) function. Each of the memory controller chips 200 is electrically connected to a group of memory chip units 100. In the example of FIG. 2, k memory chip units 100_1, . . . , and **100_*k* are connected in parallel to a memory controller chip 200 (where k is an integer equal to or larger than 2). Each of the memory controller chips 200 controls the k memory chip units 100_1 to 100_*k* in parallel based on an instruction from the interface control system 7**.

Specifically, a memory controller chip 200 may write the write data into the write target memory chip unit 100 based on the write request from the host device 2. The memory controller chip 200 also reads the read data from the read target memory chip unit 100 based on a read request from the host device 2. Then, the memory controller chip 200 transmits the read data to the host device 2 via the interface control system 7.

Each of the memory chip units 100 is a chip unit. The chip unit is a unit of a device capable of functioning at a chip level after dicing a wafer. In the storage system 3, however, the storage wafer 10 is utilized as a wafer, without being diced. Each of the memory chip units 100 therefore functions as a memory device, without being cut into chips, in a state of being provided on a storage wafer 10. The memory chip units 100 are configured to execute data write processing and read processing independently from one another. A memory chip unit 100 includes a plurality of memory cells that individually store data in a nonvolatile manner and a control circuit that controls the memory cells. Each of the memory chip units 100 may be a NAND flash memory.

Figure 3:
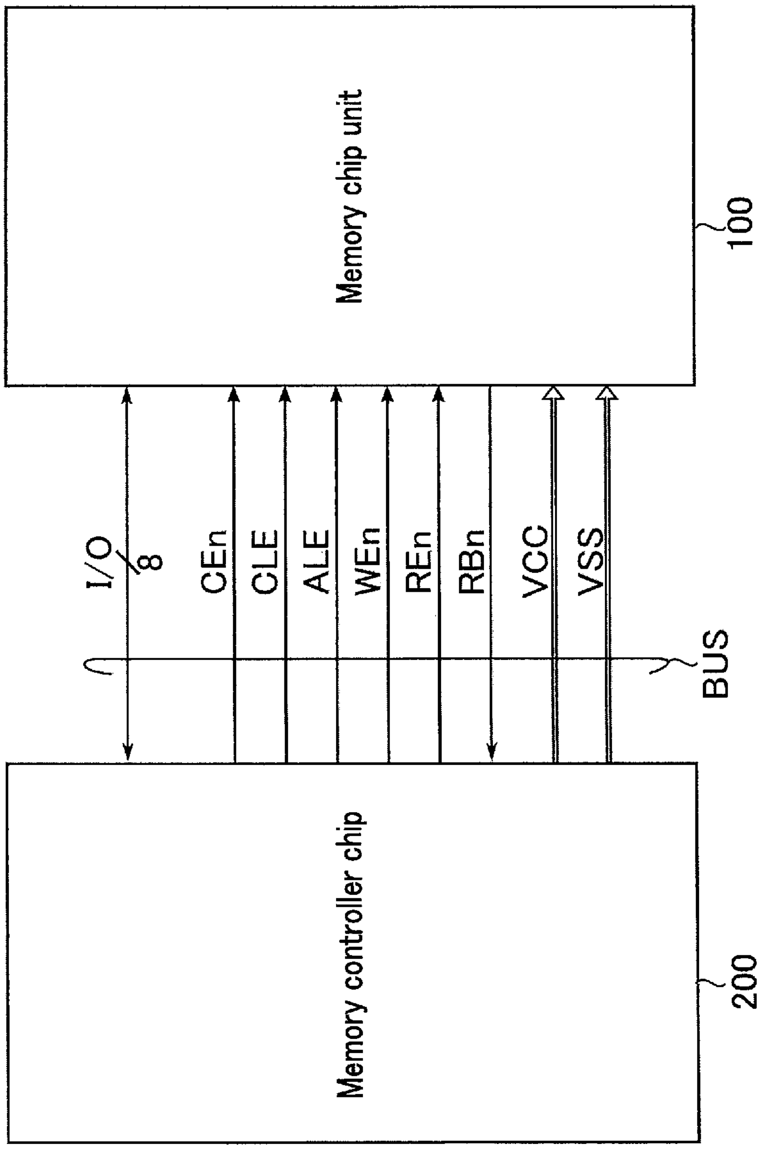
FIG. 3 is a block diagram illustrating exemplary signals and voltages used in the memory bus according to the first embodiment.

The electrical connection between the storage wafer 10 and the probe card 20 is realized by way of a memory bus BUS. The memory bus BUS conforms to, for example, a single data rate (SDR) interface, a toggle double data rate (DDR) interface, or an open NAND flash interface (ONFI). FIG. 3 is a block diagram showing exemplary signals and voltages used in the memory bus according to the first embodiment.

The examples of the signals used in the memory bus BUS include a chip enable signal CEn, a command latch enable signal CLE, an address latch enable signal ALE, a write enable signal WEn, a read enable signal REn, a write protect signal WPn, a ready/busy signal RBn, and an input/output signal I/O. Throughout this specification, it is assumed that "n" at the end of the name of a signal represents that the signal is asserted when the signal is at an "L (low)" level.

The chip enable signal CEn is a signal for enabling the memory chip unit 100.

The command latch enable signal CLE is a signal for notifying the memory chip unit 100 that the input signal I/O transmitted to the memory chip unit 100 represents a command.

The address latch enable signal ALE is a signal for notifying the memory chip unit 100 that the input signal I/O to the memory chip unit 100 represents an address.

The write enable signal WEn is a signal for causing the memory chip unit 100 to fetch the input signal I/O.

The read enable signal REn is a signal for reading the output signal I/O from the memory chip unit 100.

The write protect signal WPn is a signal for instructing the memory chip unit 100 to prohibit data writing and erasing.

The ready/busy signal RBn is a signal indicating whether the memory chip unit 100 is in a ready state or a busy state. In a ready state, the memory chip unit 100 is in a state in which it can receive a command from the memory controller chip 200. In a busy state, the memory chip unit 100 is in a state in which it cannot receive a command from the memory controller chip 200. The "L" level of the ready/busy signal RBn indicates a busy state.

The input/output signal I/O is, for example, an 8-bit signal. The input/output signal I/O is the data entity transmitted and received between the memory chip unit 100 and the memory controller chip 200. The input/output signal. I/O includes a command, an address, and data such as write data and read data.

Furthermore, voltages VSS and VCC are supplied to the memory chip units 100 via the memory bus BUS, where the voltage VSS represents a ground voltage, and the voltage VCC represents a power supply voltage.

In the following description, the chip enable signal CEn, the command latch enable signal CLE, the address latch enable signal ALE, the write enable signal WEn, the read enable signal REn, the write protect signal WPn, the ready/busy signal RBn, and the input/output signal I/O may be simply referred to as signals. The voltages VSS and VCC may also be simply referred to as signals.

1.1.3.2. Configuration

Figure 4:
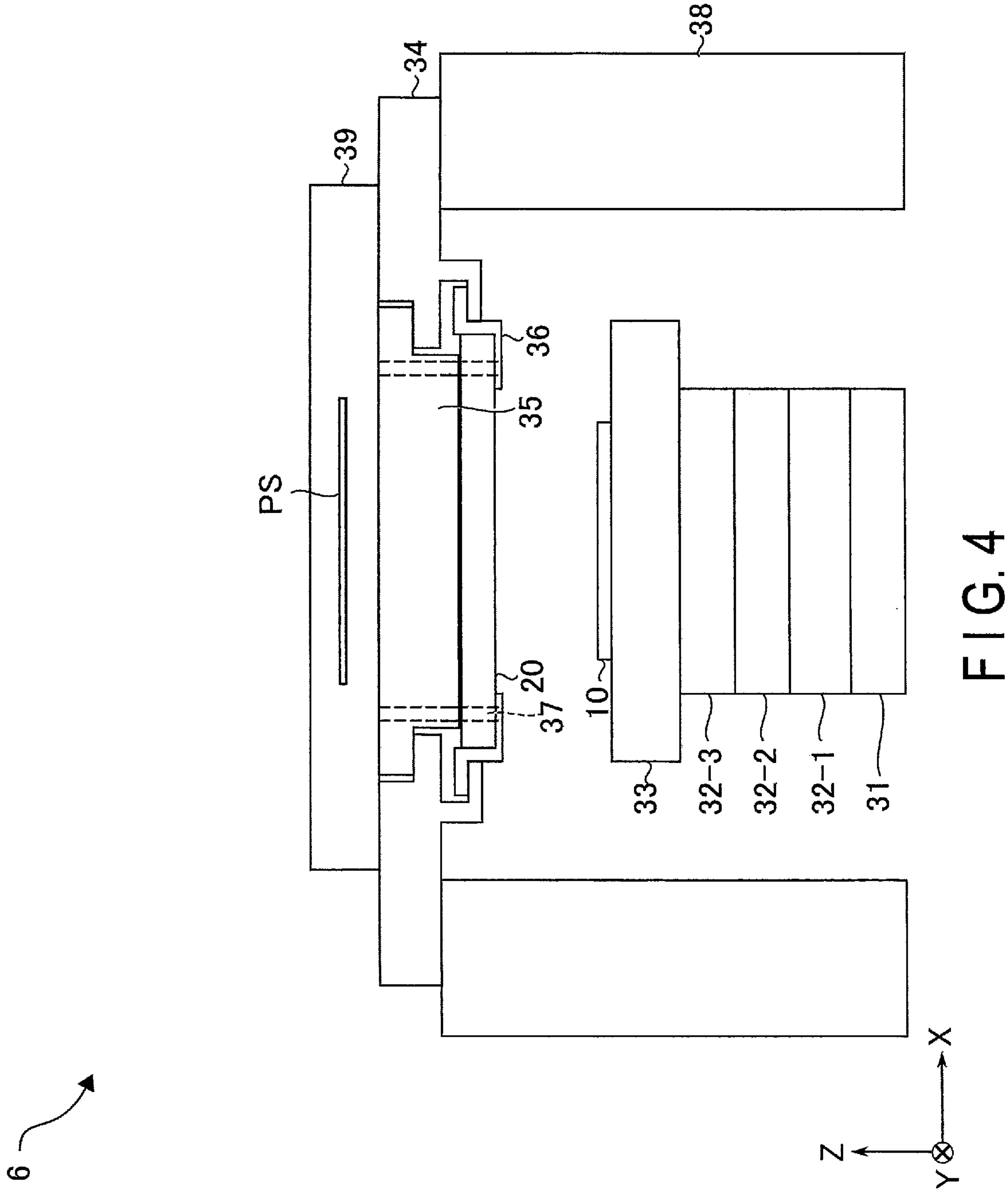
FIG. 4 is a cross-sectional view showing an exemplary configuration of the prober according to the first embodiment.

Next, the configuration of the prober according to the first embodiment will be described with reference to FIG. 4. In FIG. 4, a cross-sectional view showing an exemplary configuration of the prober according to the first embodiment is presented. The cross-sectional view of FIG. 4 shows the prober 6 in which a storage wafer 10 and a probe card 20 are installed.

Hereinafter, the placement surface of the prober 6 on which a storage wafer 10 is placed is defined as an XY plane. The direction perpendicular to the XY plane is defined as a Z direction. The direction from the storage wafer 10 toward the probe card 20 along the Z direction is referred to as an upward direction.

A surface of the storage wafer 10 facing the probe card 20 may also be referred to as a "top surface", or "first surface", of the storage wafer 10. A surface of the storage wafer 10 placed on the prober 6 may also be referred to as a "bottom surface", or "second surface", of the storage wafer 10. A surface of the probe card 20 facing the top surface of the storage wafer 10 may also be referred to as a "bottom surface" of the probe card 20, or "opposite surface" facing the storage wafer 10. A surface of the probe card 20 opposite to the bottom surface of the probe card 20 may also be referred to as the "top surface" of the probe card 20.

As shown in FIG. 4, the prober 6 includes a base 31, a plurality of stages 32-1, 32-2, and 32-3, a wafer chuck 33, a head stage 34, a stiffener 35, a card holder 36, a fixation member 37, pillars 38, and a test head 39.

The base 31 supports the stages 32-1 to 32-3 and the wafer chuck 33. In particular, a stage 32-1 having an X displacement mechanism is provided on the top surface of the base 31. A stage 32-2 having a Y displacement mechanism is provided on the top surface of the stage 32-1. A stage 32-3 having a Zθ displacement mechanism is provided on the top surface of the stage 32-2.

The stages 32-1 to 32-3 constitute part of the torque mechanism of the drive control system 8. With the X displacement mechanism, the stage 32-1 is freely movable in the X direction with respect to the base 31. With the Y displacement mechanism, the stage 32-2 is freely movable in the Y direction with respect to the stage 32-1. With the Zθ displacement mechanism, the stage 32-3 is freely movable in the Z direction with respect to the stage 32-2, and freely rotatable on the XY plane. In other words, the X displacement mechanism, Y displacement mechanism, and Zθ displacement mechanism can freely displace a storage wafer with respect to the probe card 20.

When the storage wafer 10 and the probe card 20 come into contact with each other, a pressure is created, and the Zθ displacement mechanism can control the distribution of such a pressure on the XY plane to be any arbitrary distribution. That is, the Zθ displacement mechanism is configured to form a pressure distribution in which pressures applied to at least two different regions that do not overlap each other differ from each other.

A wafer chuck 33 is provided on the top surface of the stage 32-3. The wafer chuck 33 is a table that supports the storage wafer 10. The wafer chuck 33 includes, for example, a temperature sensor, a heater, and a cooler (none of which are shown) inside. The heater and cooler are configured to raise and lower the temperature of the storage wafer 10. The temperature control system 9 drives the heater and the cooler based on the information from the temperature sensor so that the temperature of the storage wafer 10 can be maintained within a predetermined range via the wafer chuck 33.

The head stage 34 is supported above the wafer chuck 33 by the pillars 38. The head stage 34 may be shaped into a ring. A ring-shaped stiffener 35 and a ring-shaped card holder 36 are provided in a space inside the ring of the head stage 34. The stiffener 35 is provided on the top surface of the probe card 20 so that the probe card 20 can be held between the stiffener 35 and the card holder 36. The card holder 36 supports the probe card 20 in the space inside the ring of the card holder 36. The probe card 20 is secured to the stiffener 35 and the card holder 36 by the fixation member 37. As a result, the position of the probe card 20 is secured on the XY plane with respect to the wafer chuck 33, and any displacement that tends to be caused by a thermal expansion or the like can be suppressed.

The test head 39 is provided on the top surfaces of the head stage 34 and the stiffener 35. The test head 39 serves as the interface control system 7 with an electrical connection established with the probe card 20. A pressure sensor PS is arranged inside the test head 39. The pressure sensor PS is configured to measure the distribution of pressure produced when the storage wafer and the probe card 20 come into contact with each other. The pressure sensor PS may include a plurality of sensor elements, which are arranged in a dispersed manner across the XY plane.

With the above-described configuration, the drive control system 8 can physically bring the storage wafer 10 and the probe card 20 into contact with each other while applying different pressures to at least two regions on the XY plane.

The head stage 34 may be provided with a camera (not shown) to detect a benchmark position on the storage wafer 10. The benchmark position on the storage wafer 10 may be the outer edge of the wafer or an alignment mark provided on the wafer. The drive control system 8 accurately recognizes the reference position based on the information from the camera. In this manner, the drive control system 8 can perform control such that the storage wafer 10 and the probe card 20 can be precisely aligned.

1.1.4. Cross-Sectional Configuration of Storage Wafer and Probe Card

Figure 5:
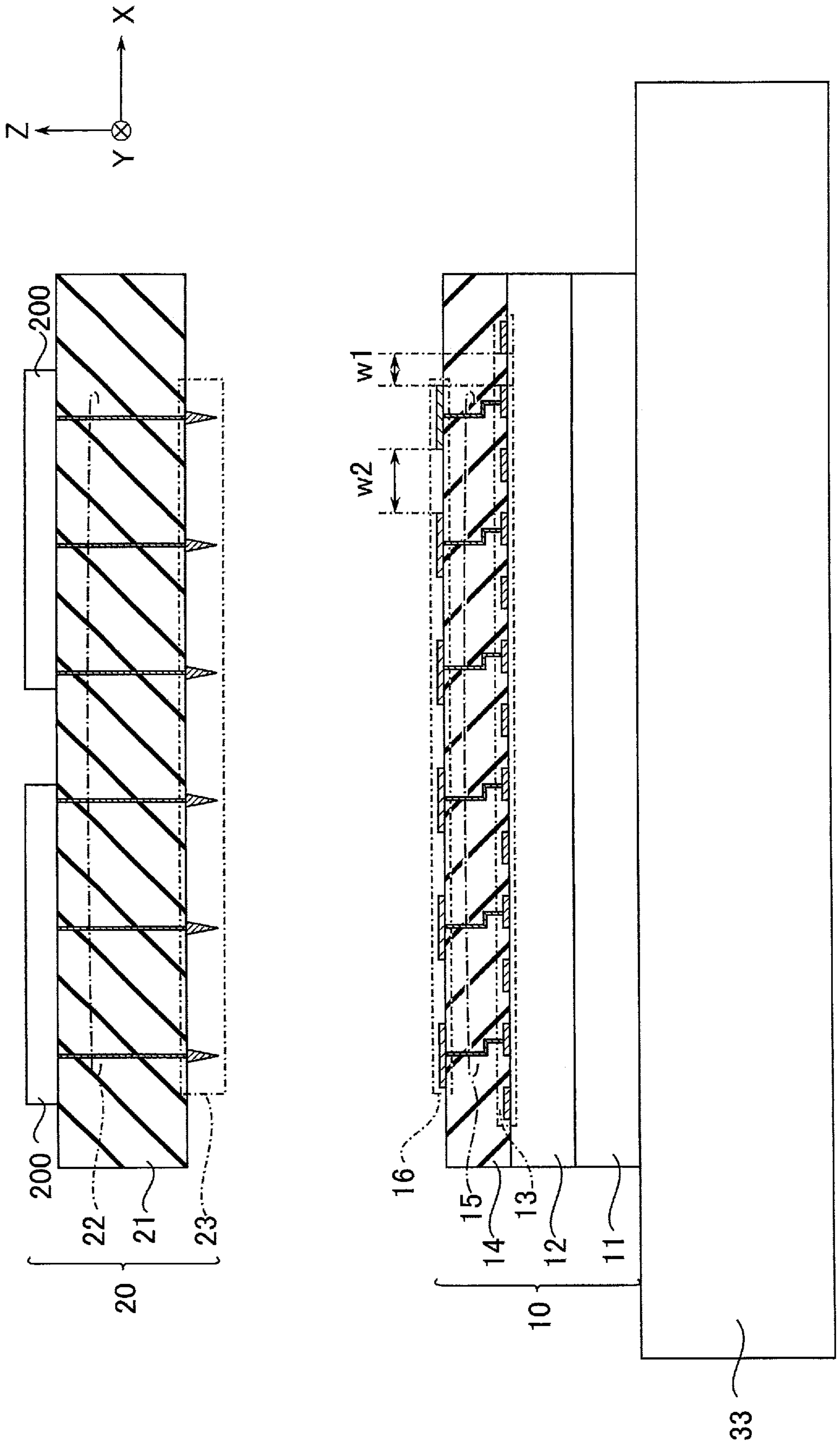
FIG. 5 is a cross-sectional view illustrating an exemplary configuration of a storage wafer and a probe card according to the first embodiment.

Next, a cross-sectional configuration of the storage wafer and the probe card according to the first embodiment will be described. FIG. 5 is a cross-sectional view showing an exemplary configuration of the storage wafer and the probe card placed in the prober according to the first embodiment.

As shown in FIG. 5, the storage wafer 10 includes a substrate 11, an element layer 12, a plurality of electrodes 13, an insulating layer 14, a plurality of wirings 15, and a plurality of electrodes 16. The probe card 20 includes, in addition to the memory controller chips 200, a substrate 21, a plurality of wirings 22, and a plurality of electrodes 23.

The substrate 11 may be a silicon wafer. The element layer 12 is provided on the top surface of the substrate 11. The element layer 12 is a layer in which a plurality of memory chip units 100 are provided. In the example of FIG. 5, the memory chip units 100 in the element layer 12 are omitted from the illustration.

A plurality of electrodes 13 are provided on the top surface of the element layer 12. Each of the electrodes 13 is positioned directly above the corresponding memory chip units 100. That is, these electrodes 13 represent electrodes in a state prior to the rearrangement. Each of the electrodes 13 may be a plate-like pad electrode. For example, any two adjacent electrodes 13 are arranged so as to be separated from each other by an interval w1. The electrodes 13 may include aluminum (Al).

An insulating layer 14 is provided in such a manner as to cover the top surface of the element layer 12 and the top surfaces of the electrodes 13. The insulating layer 14 may include polyimide.

A plurality of electrodes 16 are provided on the top surface of the insulating layer 14. The electrodes 16 are arranged in a region independent of the region in which the corresponding electrodes 13 (i.e., corresponding memory chip units 100) are provided. That is, the electrodes 16 represent electrodes in a state after the rearrangement. Each of the electrodes 16 may be a plate-like pad electrode. Any two adjacent electrodes 16 are arranged so as to be separated from each other by an interval w2, which is longer than the interval w1. The area of an electrode 16 is larger than the area of an electrode 13. The electrodes 16 include, for example, nickel (Ni) and/or gold (Au).

A plurality of wirings 15 are provided in the insulating layer 14 to electrically connect the electrodes 13 to the electrodes 16. The wirings 15 are re-wirings for rearranging the electrodes 13 into the electrodes 16. In the example of FIG. 5, the wirings 15 that electrically connect the electrode 13 (shown) and the electrode 16 (not shown) are omitted from the illustration. The wirings 15 may include copper (Cu).

The substrate 21 includes, for example, a printed circuit board. A plurality of memory controller chips 200 are provided on the top surface of the substrate 21. A plurality of electrodes 23 are provided on the bottom surface of the substrate 21. The electrodes 23 are provided at positions corresponding to the electrodes 16. Each of the electrodes 23 may be a probe electrode having a pin shape. A plurality of wirings 22 are provided in the substrate 21. The wirings 22 electrically connect the memory controller chips 200 to the electrodes 23.

1.1.5. Layout of Storage Wafer

Figure 6:
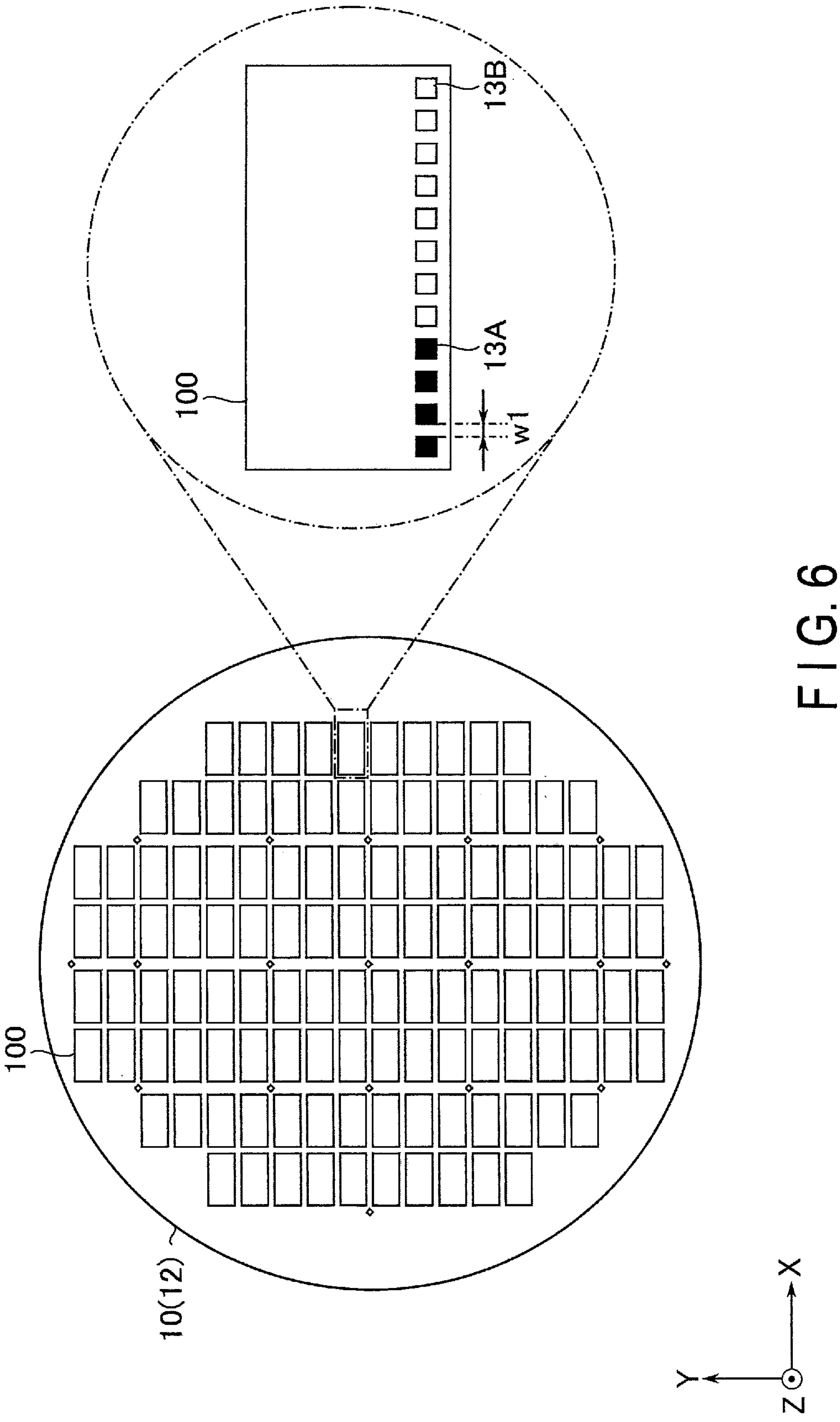
FIG. 6 is a plan view showing an exemplary layout of a plurality of memory chip units and a plurality of electrodes before being rearranged in the storage wafer according to the first embodiment.
Figure 7:
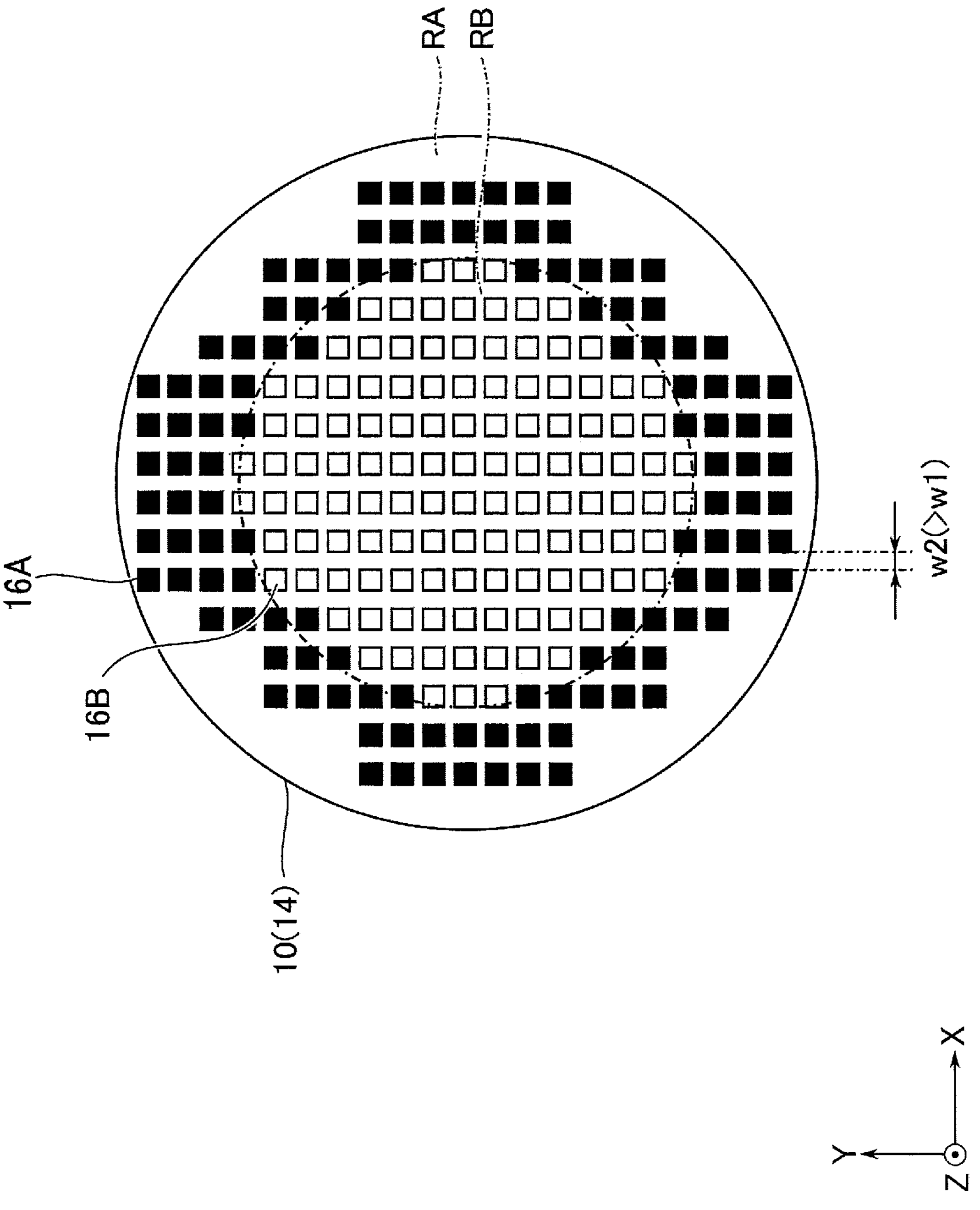
FIG. 7 is a plan view showing an exemplary layout of a plurality of electrodes that have been rearranged in the storage wafer according to the first embodiment.

Next, the layout of a storage wafer according to the first embodiment will be described. FIG. 6 is a plan view showing an exemplary layout of a plurality of memory chip units and a plurality of electrodes before being rearranged in the storage wafer according to the first embodiment, and FIG. 7 is a plan view showing an exemplary layout of a plurality of electrodes that have been rearranged in the storage wafer according to the first embodiment.

First, the layout of the memory chip units 100 and the electrodes 13 before being rearranged will be described with reference to FIG. 6. As shown in FIG. 6, the memory chip units 100 are arranged in a matrix on the XY plane.

In a plan view, the electrodes 13 are arranged in a region where the corresponding memory chip units 100 are provided. In the example of FIG. 6, a plurality of electrodes 13 corresponding to one memory chip unit 100 are arranged in the X direction. The present invention, however, is not limited thereto, and the electrodes 13 may be arranged in a matrix in a region where the corresponding memory chip unit 100 is provided.

The electrodes 13 corresponding to one memory chip unit 100 include a plurality of electrodes 13A and a plurality of electrodes 13B. The electrodes 13A and the electrodes 13B differ in minimum pressures (pressure thresholds) required to establish a sufficient electrical connection with the electrodes 23. For instance, the pressure threshold ThA of the electrodes 13A is higher than the pressure threshold ThB of the electrodes 13B. The electrodes 13A may be used to supply a voltage. The electrodes 13B may be used to communicate signals.

Next, the layout of the electrodes 16 that have been rearranged will be described with reference to FIG. 7. In a plan view as shown in FIG. 7, the electrodes 16 are arranged in a region independent of that of the corresponding memory chip units 100.

The electrodes 16 corresponding to one memory chip unit 100 include a plurality of electrodes 16A and a plurality of electrodes 16B. An electrode 16A may be used to supply a voltage. An electrodes 16B may be used to communicate a signal. For this reason, the electrodes 16A and 16B have pressure thresholds substantially equal to those of the electrodes 13A and 13B, respectively.

On the top surface of the insulating layer 14, the electrodes 16A and 16B are arranged in the regions RA and RB, respectively. The regions RA and RB do not overlap each other. In the example of FIG. 7, the regions RA and RB are concentric on the top surface of the storage wafer 10. That is, in a plan view, the region RB includes the center of the storage wafer 10, while the region RA is located outside the region RB with respect to the center of the storage wafer 10.

The regions RA and RB do not need to be concentric regions. It will be sufficient if the regions RA and RB do not overlap each other and are independent of the region in which the memory chip units 100 are provided. For instance, the regions RA and RB may be a left region and a right region, respectively, of the top surface of the storage wafer 10, when viewed on the drawing sheet. Furthermore, a boundary region which belongs to neither region RA nor RB may be provided between the region RA and the region RB. This boundary region may not have any electrodes 16A or 16B arranged.

Figure 8:
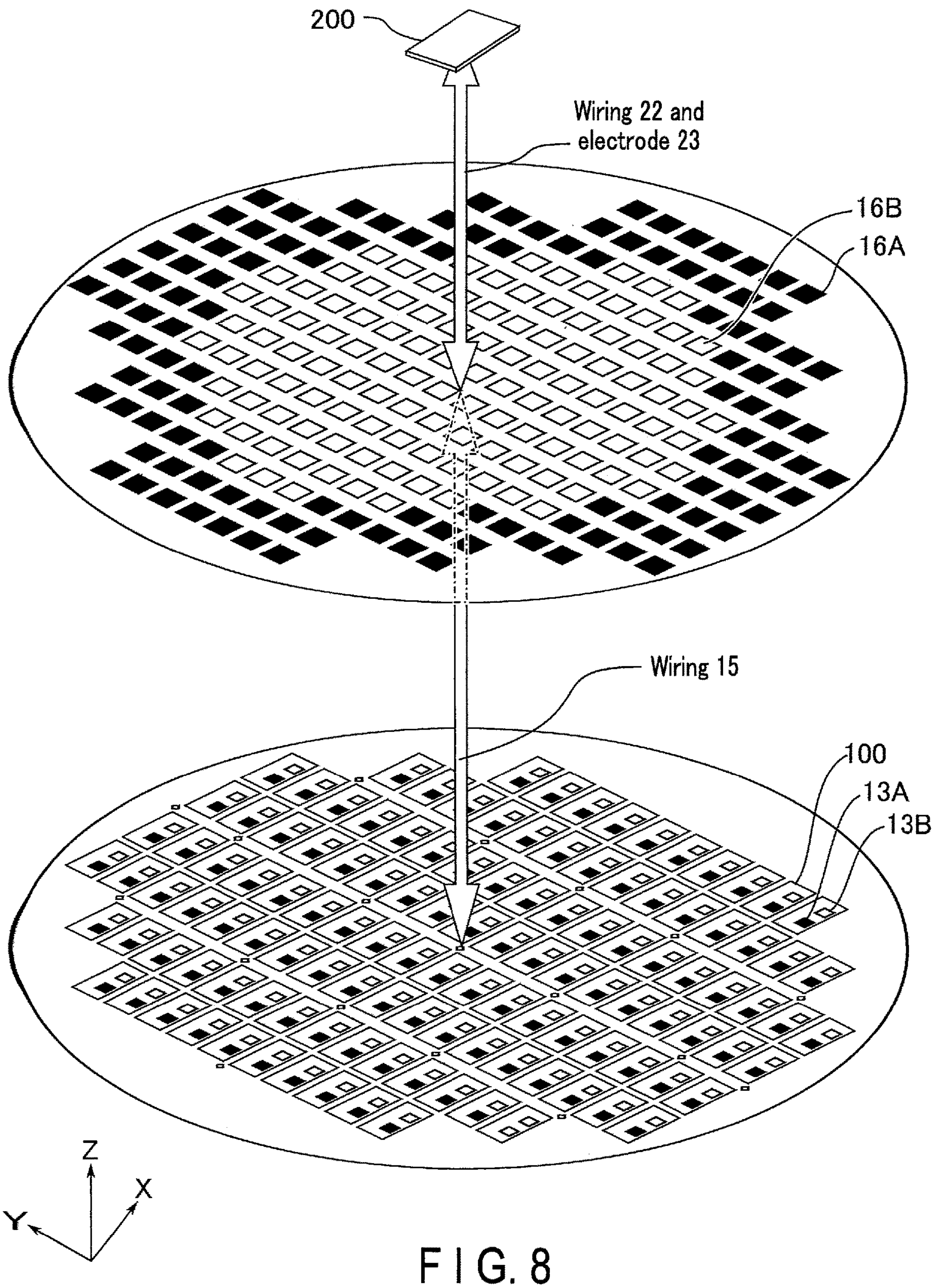
FIG. 8 is a schematic diagram illustrating electrical connection paths between the memory chip units and a memory controller chip according to the first embodiment.

The memory chip units 100 and the memory controller chips 200 are electrically connected to each other via the electrodes 13 and electrodes 16 as described above. FIG. 8 is a schematic diagram illustrating electrical connection paths between the memory chip units and a memory controller chip according to the first embodiment.

As shown in FIG. 8, the memory chip units 100 are electrically connected to the electrodes 13A and 13B arranged in the region where the memory chip units 100 are provided. The electrodes 13A and 13B are electrically connected to the electrodes 16A and 16B via a plurality of wirings 15 that extend in the Z direction inside the insulating layer 14. Unlike the electrodes 13A and 13B, the electrodes 16A and 16B are arranged in a region independent of the region in which the corresponding memory chip units 100 are provided. In particular, the electrodes 16A and 16B are respectively arranged in the regions RA and RB, which do not overlap with each other. The electrodes 16A and 16B are electrically connected to the corresponding memory controller chips 200 on the probe card 20 via the corresponding electrodes 23 and wirings 22.

With the above-described configuration, all of the electrodes 16A and 16B provided on the storage wafer can be arranged in the regions RA and RB, which do not overlap with each other. Thus, the problem of individually controlling the pressure applied to all the electrodes 16A and the pressure applied to all the electrodes 16B can be dealt with as a problem of individually controlling the pressure applied to the region A and the pressure applied to the region B.

1.2. Pressure Control Operation

Figure 9:
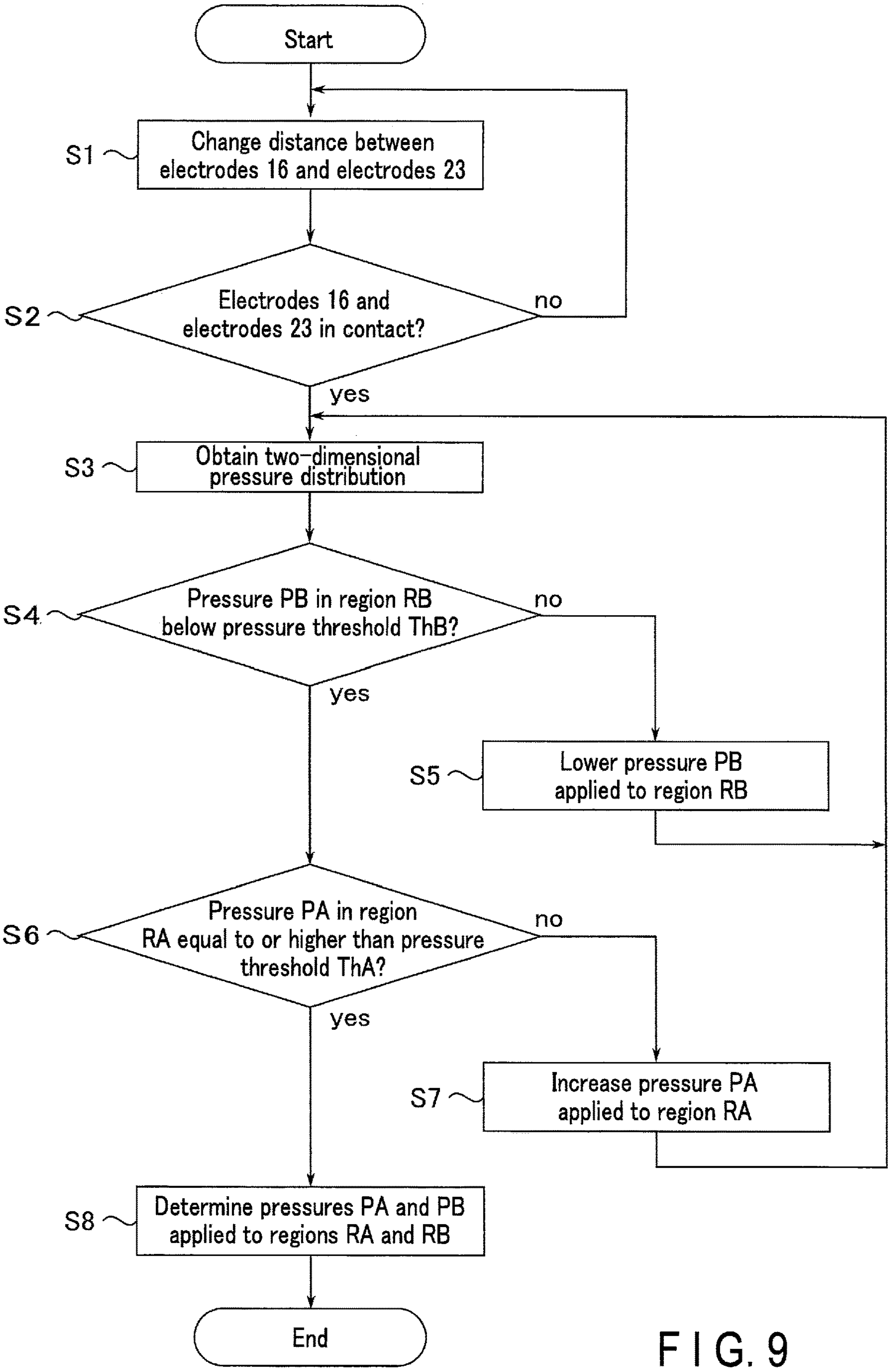
FIG. 9 is a flowchart showing an exemplary pressure control operation of the prober according to the first embodiment.

Next, the pressure control operation of the prober according to the first embodiment will be described. FIG. 9 is a flowchart showing an exemplary pressure control operation of the prober according to the first embodiment. The pressure control operation in the process (touch-down process) for physically and electrically connecting the storage wafer 10 and the probe card 20 is illustrated in FIG. 9.

Upon receipt of an instruction to electrically connect the storage wafer 10 and the probe card 20 ("Start"), the drive control system 8 drives the torque mechanism to change the distance between the electrodes 16 and electrodes 23 (S1), as shown in FIG. 9.

The drive control system 8 determines whether or not the electrodes 16 and electrodes 23 are brought into contact with each other (S2). In particular, the drive control system 8 may determine the displacement amount of the torque mechanism based on the information obtained from a camera or the like. The drive control system 8 moves the Zθ displacement mechanism by the determined displacement amount, and thereby determines that the electrodes 16 and electrodes 23 have come into contact with each other.

If the displacement amount of the Zθ displacement mechanism does not reach the determined displacement amount (no at S2), the drive control system 8 continues to change the distance between the electrodes 16 and the electrodes 23 (S1). If the displacement amount of the Zθ displacement mechanism has reached the determined displacement amount (yes at S2), the drive control system 8 obtains a two-dimensional pressure distribution from the pressure sensor PS (S3).

After the operation of S3, the drive control system 8 determines, based on the obtained two-dimensional pressure distribution, whether or not the pressure PB in the region RB is below the pressure threshold ThB (S4). If the pressure. PB in the region RB is equal to or higher than the pressure threshold ThB (no at S4), the drive control system 8 lowers the pressure PB that is being applied to the region RB (S5). After the operation of S5, the process proceeds to S3. In this manner, the pressure PB applied to the region RB is reduced until the pressure PB in the region RB becomes lower than the pressure threshold ThB.

If the pressure PB in the region RB is less than pressure threshold ThB (yes at S4), the drive control system 8 determines whether the pressure PA in the region RA is equal to or higher than the pressure threshold ThA based on the obtained two-dimensional pressure distribution (S6). If the pressure PA in the region RA is lower than the pressure threshold ThA (no at S6), the drive control system 8 increases the pressure PA that is being applied to the region RA (S7). After the operation of S7, the process proceeds to S3. In this manner, the pressure PA applied to the region RA is increased until the pressure PB in the region RB becomes lower than the pressure threshold ThB and the pressure PA in the region RA becomes equal to or higher than the pressure threshold ThA.

If the pressure PA in the region RA is equal to or higher than the threshold pressure ThA (yes at S6), the drive control system 8 determines the pressures PA and PB to be applied to the regions RA and RB (S8).

After the operation of S8 is complete, the drive control system 8 determines that each of the electrodes 16A and 16*b* is electrically connected to the corresponding one of the electrodes 23. Then, the pressure control operation is terminated ("End").

1.3. Effects According to First Embodiment

Figure 10:
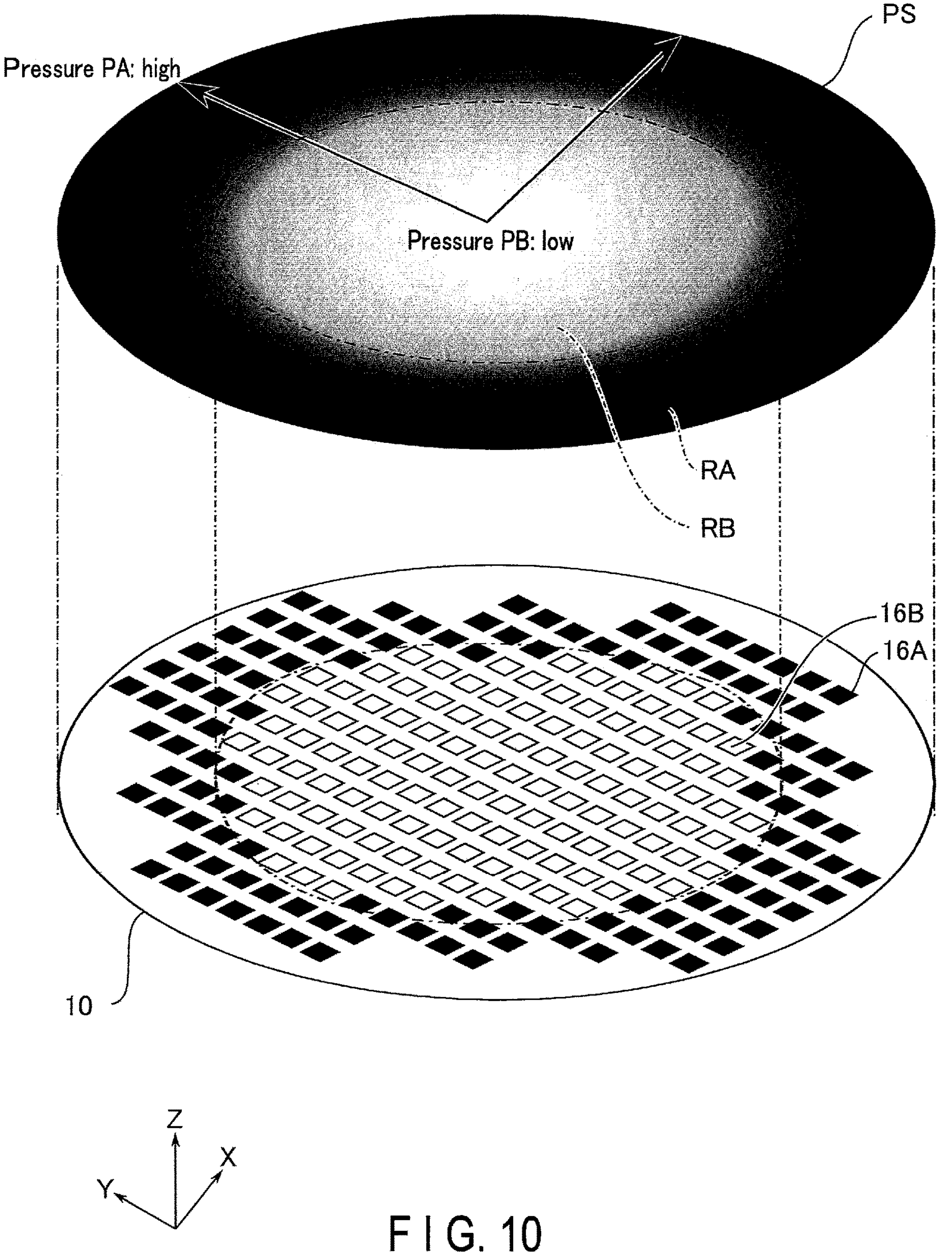
FIG. 10 is a schematic view showing an example of different pressures applied to two different regions in the prober according to the first embodiment.

According to the first embodiment, deterioration of the communication reliability between a storage wafer and the probe card can be suppressed. This effect will be described below with reference to FIG. 10. The schematic view of FIG. 10 shows an exemplary difference in the pressures applied to two regions in the prober according to the first embodiment.

The electrodes 16A and 16B are arranged respectively in the regions RA and RB, which do not overlap with each other and are independent of the region in which the corresponding memory chip units 100 are provided. As a result, all the electrodes 16A can be concentrated in the region RA and all the electrodes 16B can be concentrated in the region RB, regardless of which electrodes correspond to which memory chip units 100.

In addition, all of the electrodes 13A and 13B are arranged within a region where the corresponding memory chip units 100 are provided. When the wafer is viewed as a whole, the electrodes 13A and 13B are provided in a mixed manner across the entire surface that is in contact with the probe card 20. This means that it may be very difficult to apply appropriate pressures respectively to the electrodes 13A and electrodes 13B.

According to the first embodiment, the electrodes 13A and 13B are rearranged into the electrodes 16A and 16B via the wirings 15. As a result, the electrodes 16A and electrodes 16B, which have mutually different pressure thresholds, can be separately arranged in the regions RA and RB that differ from each other, as shown in FIG. 10. The pressure controllability of the drive control system 8 thereby can be enhanced.

Furthermore, the drive control system 8 includes a pressure sensor PS configured to obtain the two-dimensional pressure distribution of a region including the regions RA and RB. The drive control system 8 is configured to apply different pressures to the regions RA and RB based on the obtained two-dimensional pressure distribution. Thus, different pressures can be applied to the electrodes 16A and electrodes 16B. In particular, a relatively large pressure PA can be applied to the electrodes 16A, which have the pressure threshold ThA higher than the pressure threshold ThB, while a relatively low pressure PB can be applied to the electrodes 16B having a pressure threshold ThB, which is lower than the pressure threshold ThA. As a result, abrasion of the electrodes 16B that tends to occur under an excessively large pressure when being brought into contact with the electrodes 23 can be suppressed. In addition, a pressure that would hamper sufficient reliability will not be given to the electrodes 16A, and therefore suspension of voltage supply through the electrodes 16A will not occur. In this manner, the deterioration in communication reliability between a storage wafer and the probe card can be suppressed.

1.4. Modification of First Embodiment

The first embodiment described above can be modified in various ways. In the modifications described below, descriptions of the same configurations and operations as those of the first embodiment will be omitted, and the configurations and operations different from those of the first embodiment will be mainly described.

1.4.1. First Modification of First Embodiment

In the above-described first embodiment, the pressure sensor PS provided in the test head 39 has been described, which is not a limitation. For instance, the pressure sensor PS may be provided at a place outside the test head 39. Two examples of the pressure sensor PS provided at a place other than the test head 39 will be described.

First Example

Figure 11:
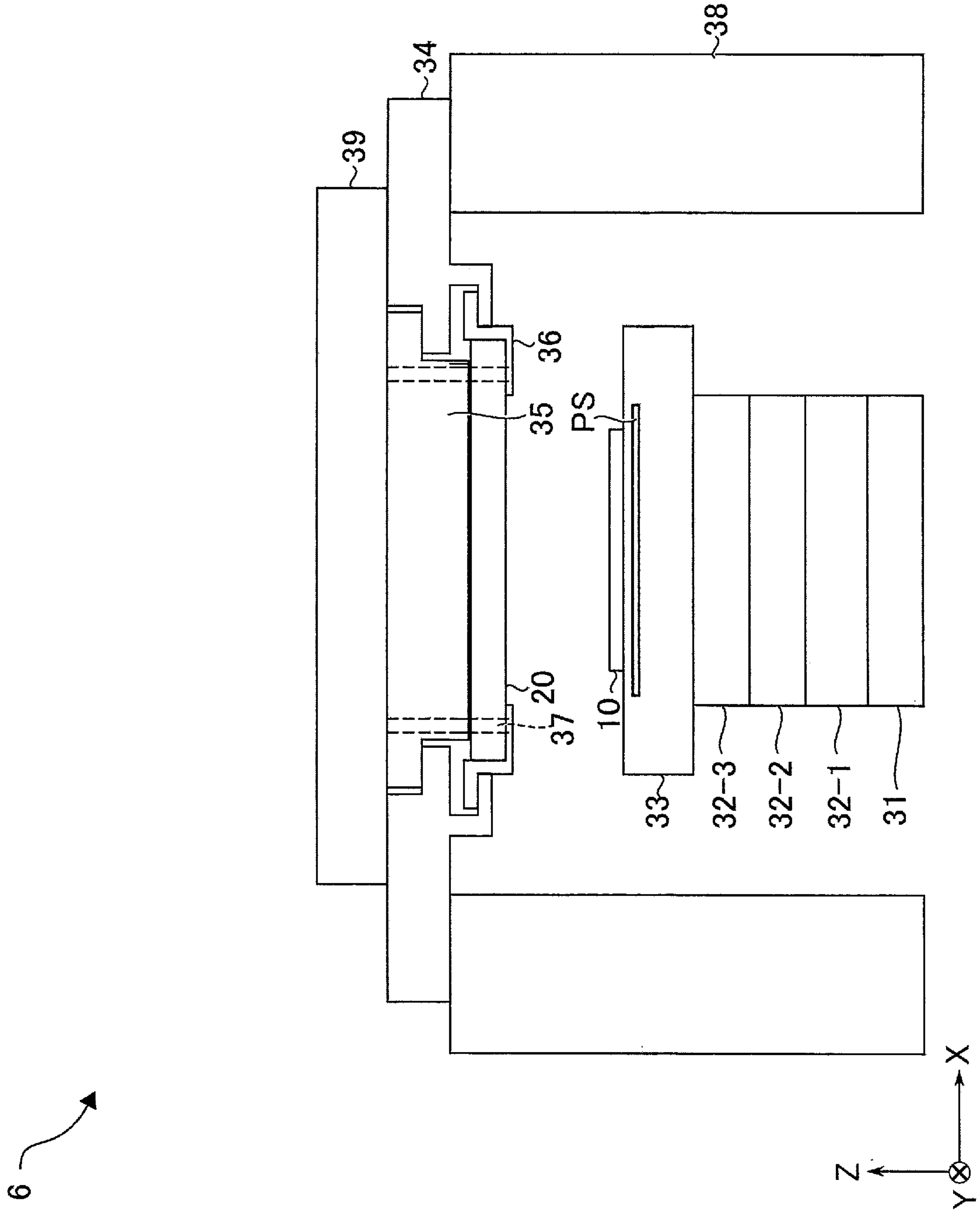
FIG. 11 is a cross-sectional view illustrating an exemplary configuration of a prober according to a first example of a first modification of the first embodiment.

FIG. 11 is a cross-sectional view illustrating an exemplary configuration of a prober according to a first example of a first modification of the first embodiment. FIG. 11 corresponds to FIG. 4 for the first embodiment.

As shown in FIG. 11, the pressure sensor PS may be provided in the wafer chuck 33. In this case, the pressure sensor PS is configured to measure the two-dimensional pressure distribution on the XY plane in the wafer chuck 33.

Second Example

Figure 12:
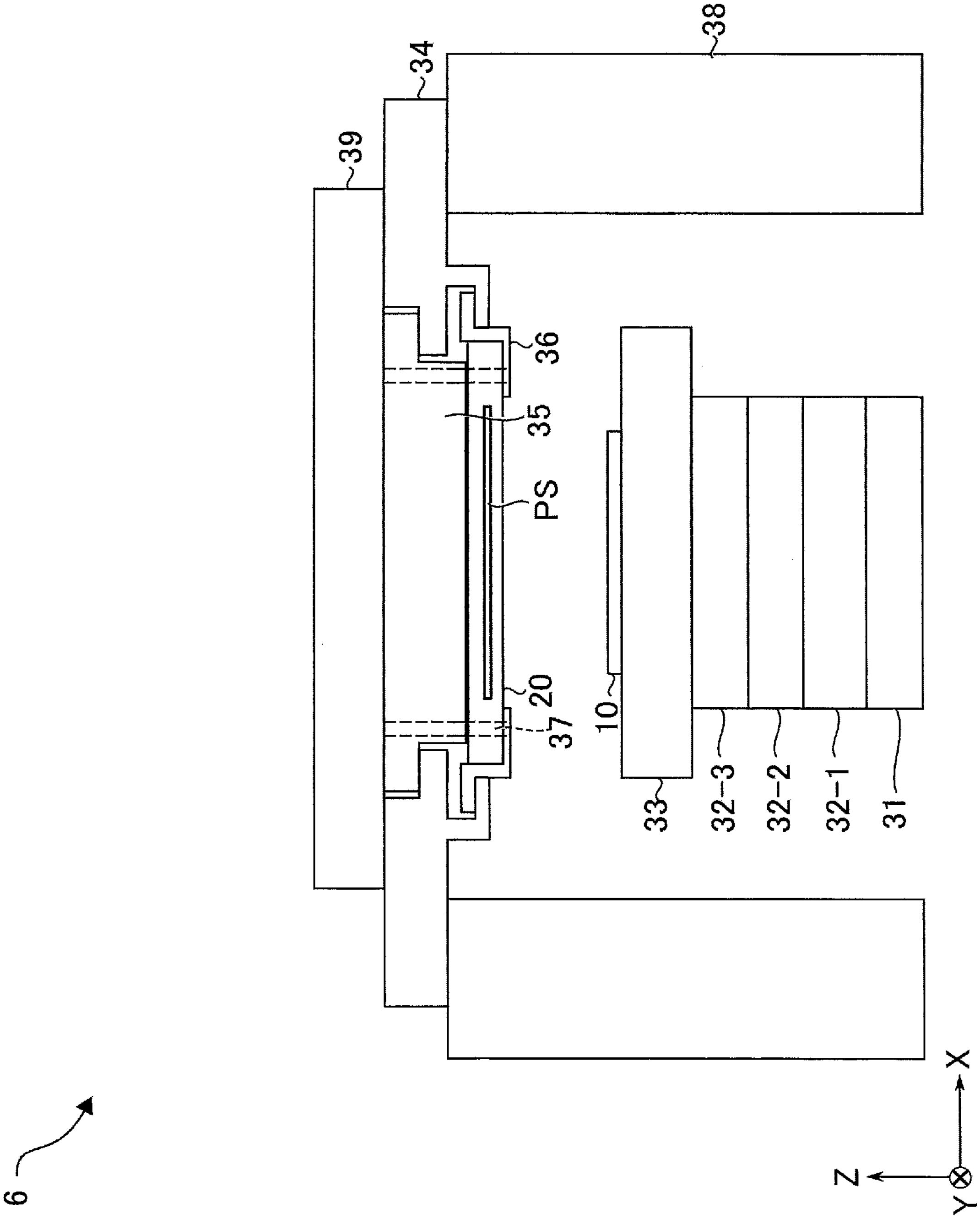
FIG. 12 is a cross-sectional view showing an exemplary configuration of a prober according to a second example of the first modification of the first embodiment.

FIG. 12 is a cross-sectional view illustrating an exemplary configuration of a prober according to a second example of the first modification of the first embodiment. FIG. 12 corresponds to FIG. 4 for the first embodiment.

As shown in FIG. 12, the pressure sensor PS may be provided in the probe card 20. In this case, the pressure sensor PS is configured to measure the two-dimensional pressure distribution on the XY plane in the probe card 20.

In either case, the pressure sensor PS can measure the two-dimensional pressure distribution in a region that includes the regions RA and RB, in the same manner as in the first embodiment. Thus, the drive control system 8 is capable of applying a suitable pressure to each of the regions RA and RB based on the two-dimensional pressure distribution obtained by the pressure sensor PS.

1.4.2. Second Modification of First Embodiment

In the first embodiment and the first modification of the first embodiment described above, the pressures applied to the electrodes 16A and 16B controlled by the torque mechanism have been described. The pressures applied to the electrodes 16A and 16B, however, may be further controlled by a mechanism other than the torque mechanism.

Figure 13:
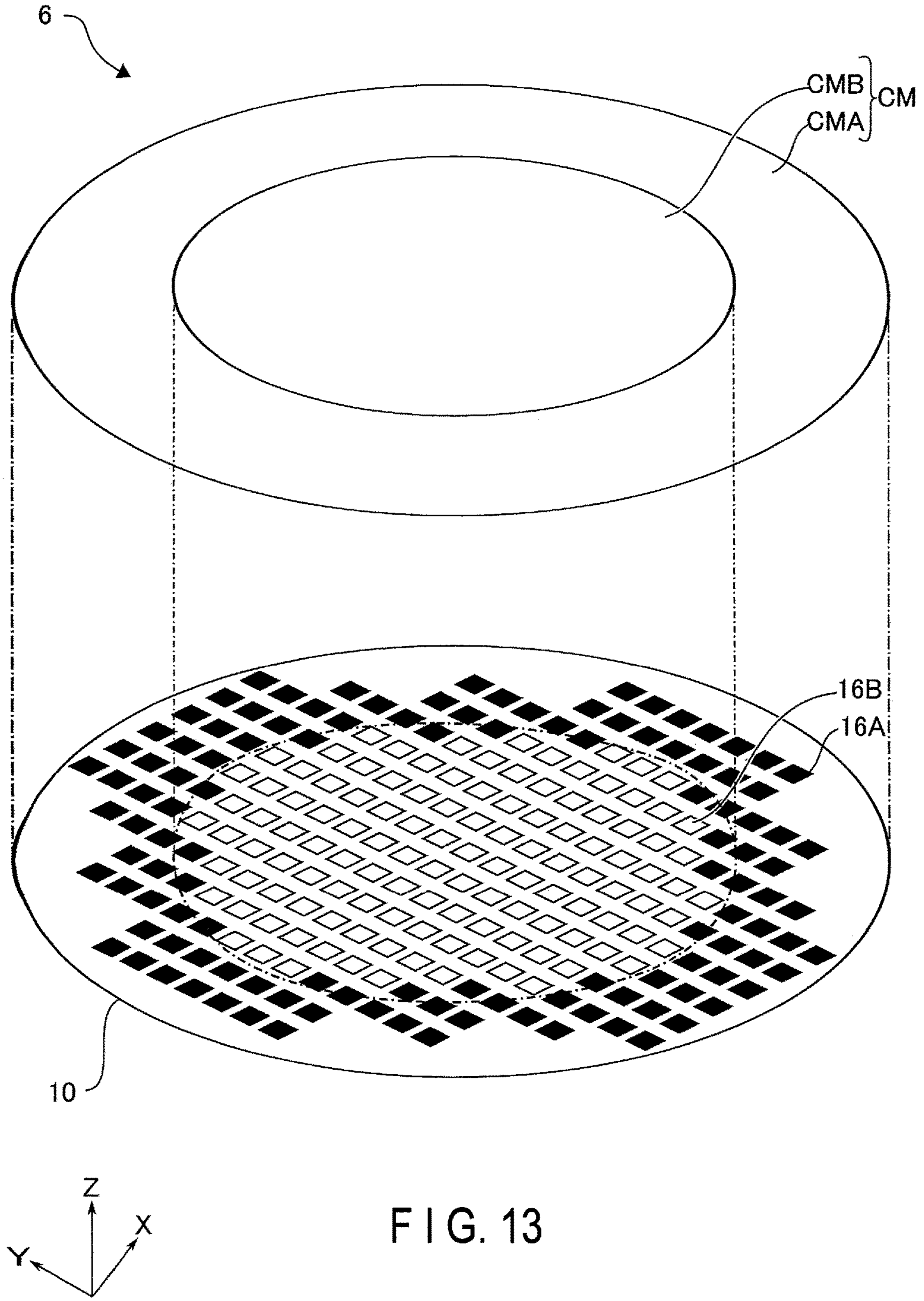
FIG. 13 is a schematic view showing an exemplary configuration of a prober according to a second modification of the first embodiment.

FIG. 13 is a schematic view showing an exemplary configuration of the prober according to a second modification of the first embodiment.

As shown in FIG. 13, the prober 6 further includes a cushioning material CM. The cushioning material CM may be an elastic body that contracts in the Z direction in response to an overload produced during a touch-down process. The overload is, for example, a load that may damage the electrodes 16 and electrodes 23. For instance, when the electrodes 16 and the electrodes 23 are brought into contact with each other, the overload may occur due to an error in determining the distance between the electrodes 16 and the electrodes 23, manufacturing variations in the distance between the electrodes 16 and the electrodes 23, and the like.

The cushioning material CM has a function of releasing the stress which tends to be concentrated on the location where the overload is caused toward the peripheral region of the overload caused location. For instance, the cushioning material CM may have a porous structure. More specifically, the cushioning material CM includes urethane. Alternatively, the cushioning material CM may have a spring structure.

The cushioning material CM may include cushioning materials CMA and CMB. The cushioning materials CMA and CMB are provided in the regions RA and RB, respectively. The cushioning material CMB may demonstrate a greater stress releasing capability than the cushioning material CMA. By providing cushioning materials CM with suitable levels of stress releasing capability in accordance with the pressure threshold values, it is possible to suppress damage to the electrodes 16 and 23.

The cushioning material CM may be provided at various positions in the prober 6. Four examples for the position where the cushioning material CM is provided will be indicated below.

First Example

Figure 14:
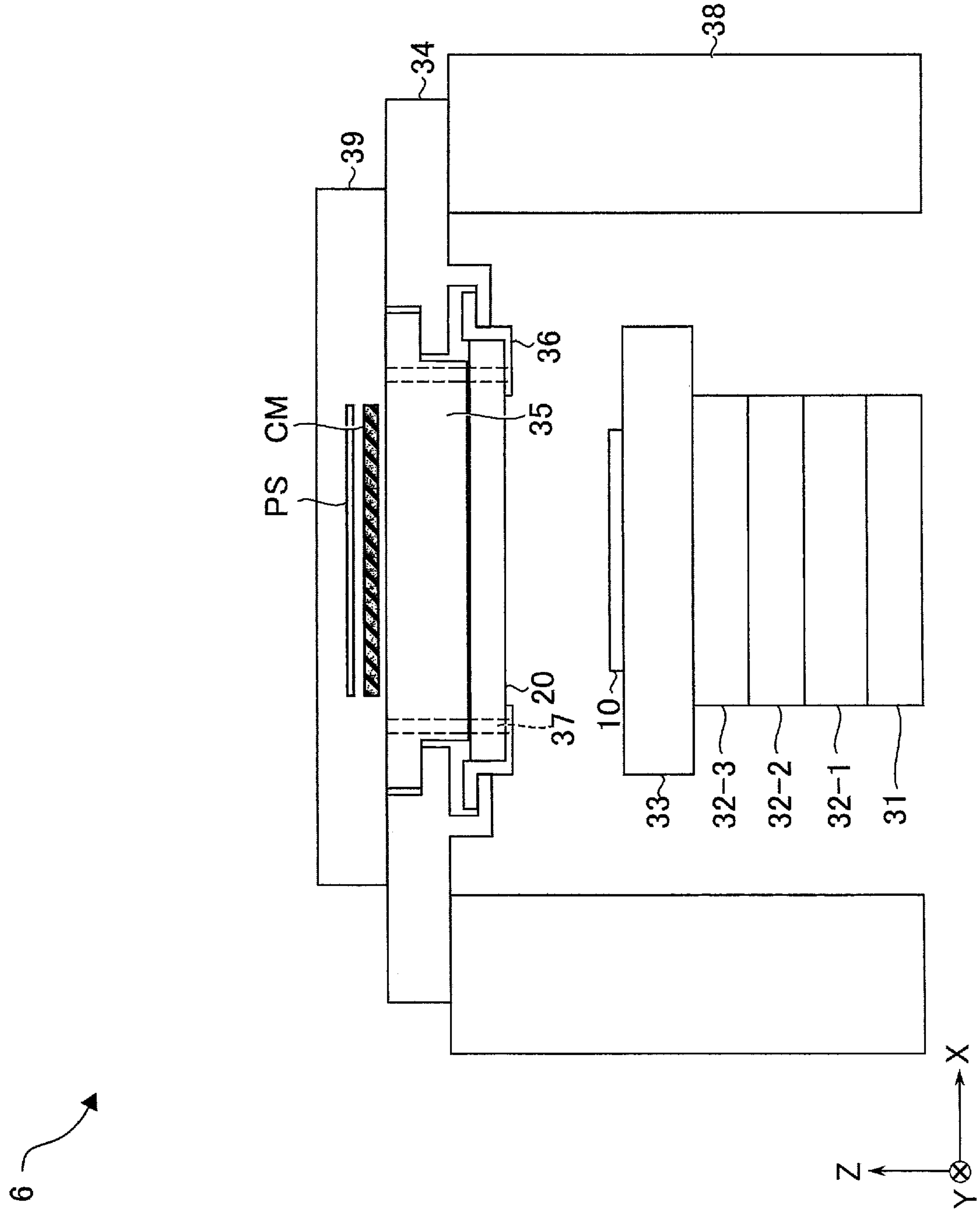
FIG. 14 is a cross-sectional view showing an exemplary configuration of a prober according to a first example of the second modification of the first embodiment.

FIG. 14 is a cross-sectional view illustrating an exemplary configuration of a prober according to a first example of the second modification of the first embodiment. FIG. 14 corresponds to FIG. 4 for the first embodiment. As shown in FIG. 14, the cushioning material CM may be provided inside the test head 39.

In the example of FIG. 14, the cushioning material CM and the pressure sensor PS are provided in different layers, which is not a limitation. For instance, the same material in the same layer may have the functions of both the cushioning material CM and the pressure sensor PS.

In the example of FIG. 14, the cushioning material CM is provided between the pressure sensor PS and the probe card 20, which is not a limitation. For instance, the cushioning material CM may be provided at a position such that the pressure sensor PS can be interposed between the cushioning material CM and the probe card 20.

In the example of FIG. 14, the pressure sensor PS provided inside the test head 39 in a manner similar to the cushioning material CM is illustrated, which is not a limitation. For instance, as shown in the first and second examples of the first modification of the first embodiment, the pressure sensor PS may be provided in the wafer chuck 33 or the probe card 20.

Second Example

Figure 15:
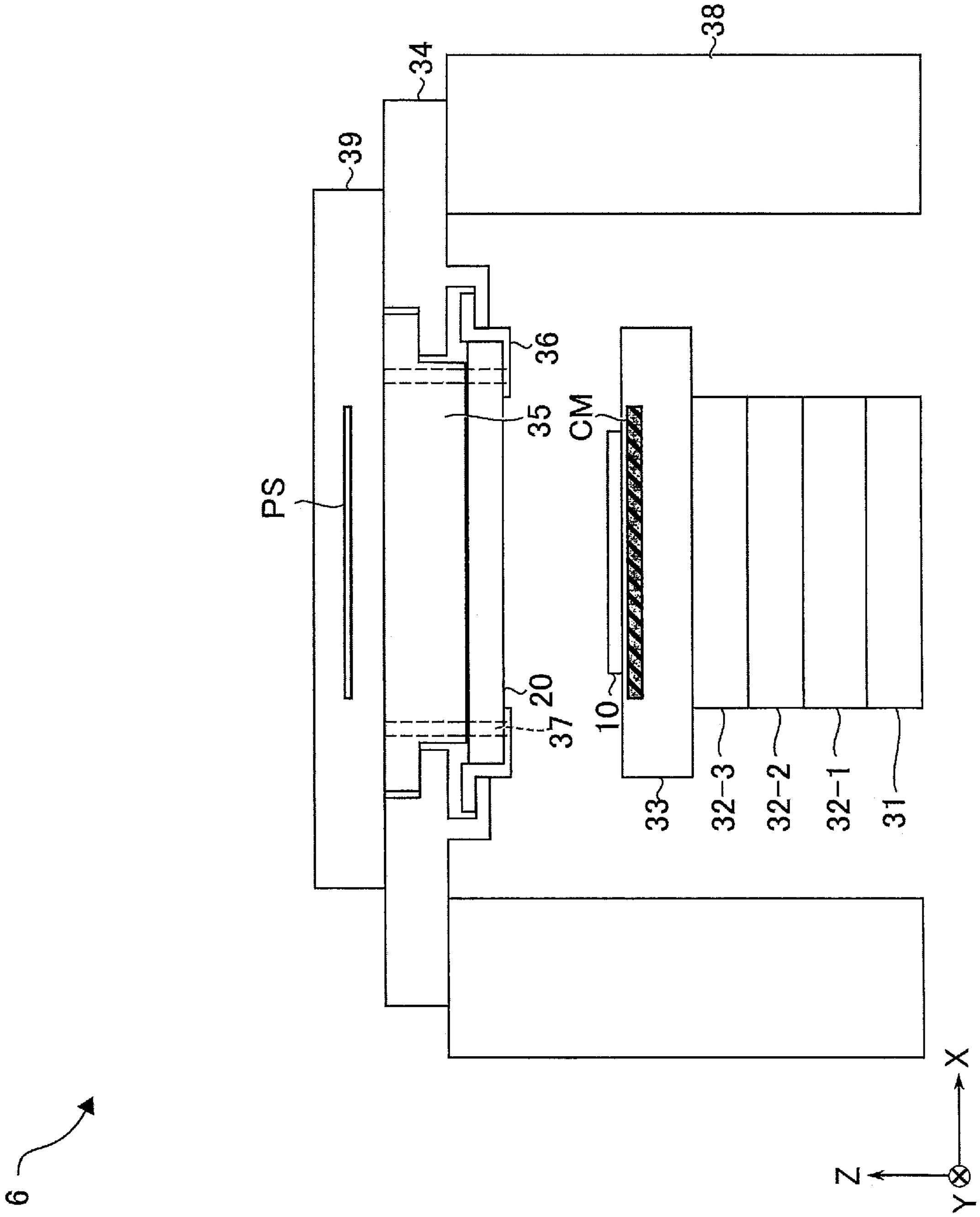
FIG. 15 is a cross-sectional view showing an exemplary configuration of a prober according to a second example of the second modification of the first embodiment.

FIG. 15 is a cross-sectional view illustrating an exemplary configuration of a prober according to a second example of the second modification of the first embodiment. FIG. 15 corresponds to FIG. 4 for the first embodiment. As shown in FIG. 15, the cushioning material CM may be provided inside the wafer chuck 33.

In the example of FIG. 15, the pressure sensor PS is provided inside the test head 39, which is not a limitation. For instance, as shown in the first and second examples of the first modification of the first embodiment, the pressure sensor PS may be provided inside the wafer chuck 33 or the probe card 20. When the pressure sensor PS is provided inside the wafer chuck 33, the cushioning material CM and the pressure sensor PS may be provided in different layers or in the same layer. When the pressure sensor PS is provided inside the wafer chuck 33, the cushioning material CM may be provided between the storage wafer 10 and the pressure sensor PS, or may be provided at a position such that the pressure sensor PS can be interposed between the cushioning material CM and the storage wafer 10.

Third Example

Figure 16:
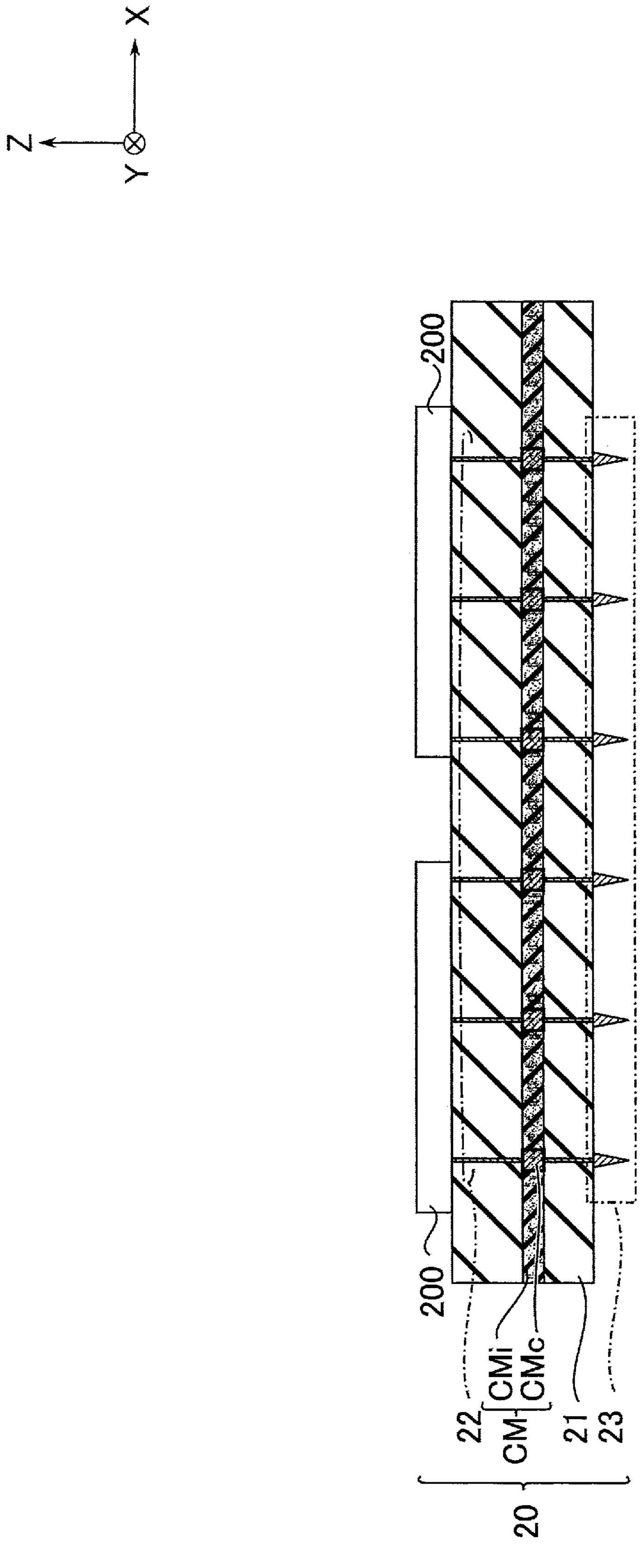
FIG. 16 is a cross-sectional view showing an exemplary configuration of a probe card according to a third example of the second modification of the first embodiment.

FIG. 16 is a cross-sectional view showing an exemplary configuration of a probe card according to a third example of the second modification of the first embodiment. FIG. 16 corresponds to part of the probe card illustrated in FIG. 5 of the first embodiment. As shown in FIG. 16, the cushioning material CM may be provided inside the probe card 20. When the cushioning material CM is provided inside the probe card 20, the cushioning material CM includes a plurality of portions CMc and a portion CMi.

The portion CMi of the cushioning material is an insulator that covers the side surfaces of the portions CMc of the cushioning material. That is, the portion CMi of the cushioning material electrically insulates the portions CMc of the cushioning material from each other. The portion CMi of the cushioning material is provided between the upper portion and lower portion of the substrate 21.

The portions CMc of the cushioning material are conductors provided in the same layer as the portion CMi of the cushioning material in such a manner as to correspond to the wirings 22. That is, each of the portions CMc of the cushioning material electrically connects the upper portion and lower portion of the corresponding wiring 22 to each other.

In the example of FIG. 16, the pressure sensor PS is not provided inside the probe card 20, which is not a limitation. For instance, as shown in the second example of the first modification of the first embodiment, the pressure sensor PS may be provided inside the probe card 20. When the pressure sensor PS is provided inside the probe card 20, the cushioning material CM and the pressure sensor PS may be provided in different layers or in the same layer. When the pressure sensor PS is provided inside the probe card 20, the cushioning material CM may be provided between the storage wafer 10 and the pressure sensor PS, or between the memory controller chip 200 and the pressure sensor PS.

Fourth Example

Figure 17:
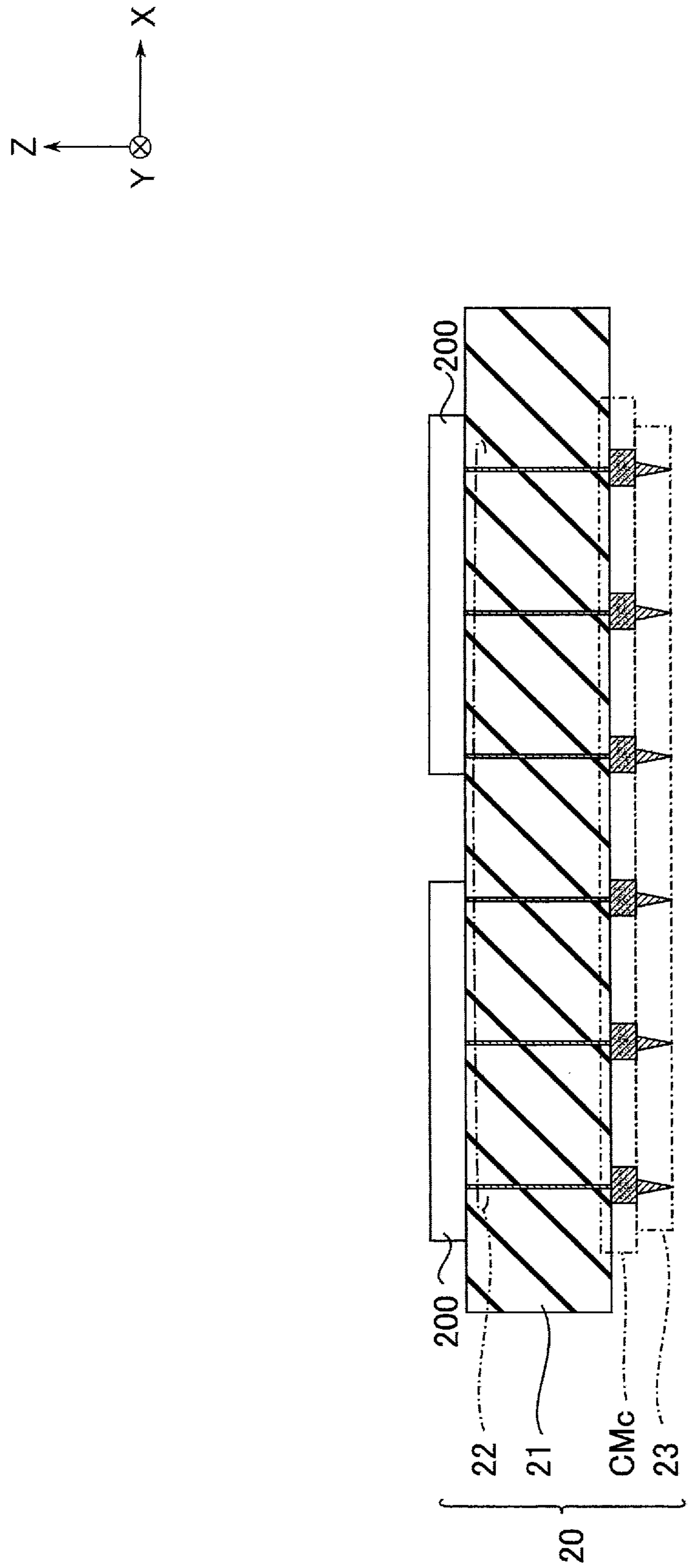
FIG. 17 is a cross-sectional view showing an exemplary configuration of a probe card according to a fourth example of the second modification of the first embodiment.

FIG. 17 is a cross-sectional view showing an exemplary configuration of a probe card according to a fourth example of the second modification of the first embodiment. FIG. 17 corresponds to part of the probe card illustrated in FIG. 5 of the first embodiment. As shown in FIG. 17, the cushioning material CM may be provided between the substrate 21 and the electrodes 23 of the probe card 20. When the cushioning material CM is provided between the substrate 21 and the electrodes 23, the cushioning material CM includes a plurality of portions CMc.

Each of the portions CMc of the cushioning material is a conductor provided to correspond to the wirings 22. That is, each of the portions CMc of the cushioning material electrically connects the corresponding wiring 22 and the corresponding electrode 23 to each other.

In the example of FIG. 17, the pressure sensor PS is not provided inside the probe card 20, which is not a limitation. For instance, as shown in the second example of the first modification of the first embodiment, the pressure sensor PS may be provided inside the probe card 20. When the pressure sensor PS is provided inside the probe card 20, the pressure sensor PS is provided in a layer different from the cushioning material CM (that is, inside the substrate 21).

According to the second modification of the first embodiment, the prober 6 further includes a cushioning material CM, as a result of which the stress concentrated on the electrodes 16 and 23 due to an overload can be released to the peripheral region, and damage to the electrodes 16 and 23 can be suppressed. In this manner, the deterioration in communication reliability between the storage wafer and the probe card can be suppressed.

1.4.3. Third Modification of First Embodiment

Figure 18:
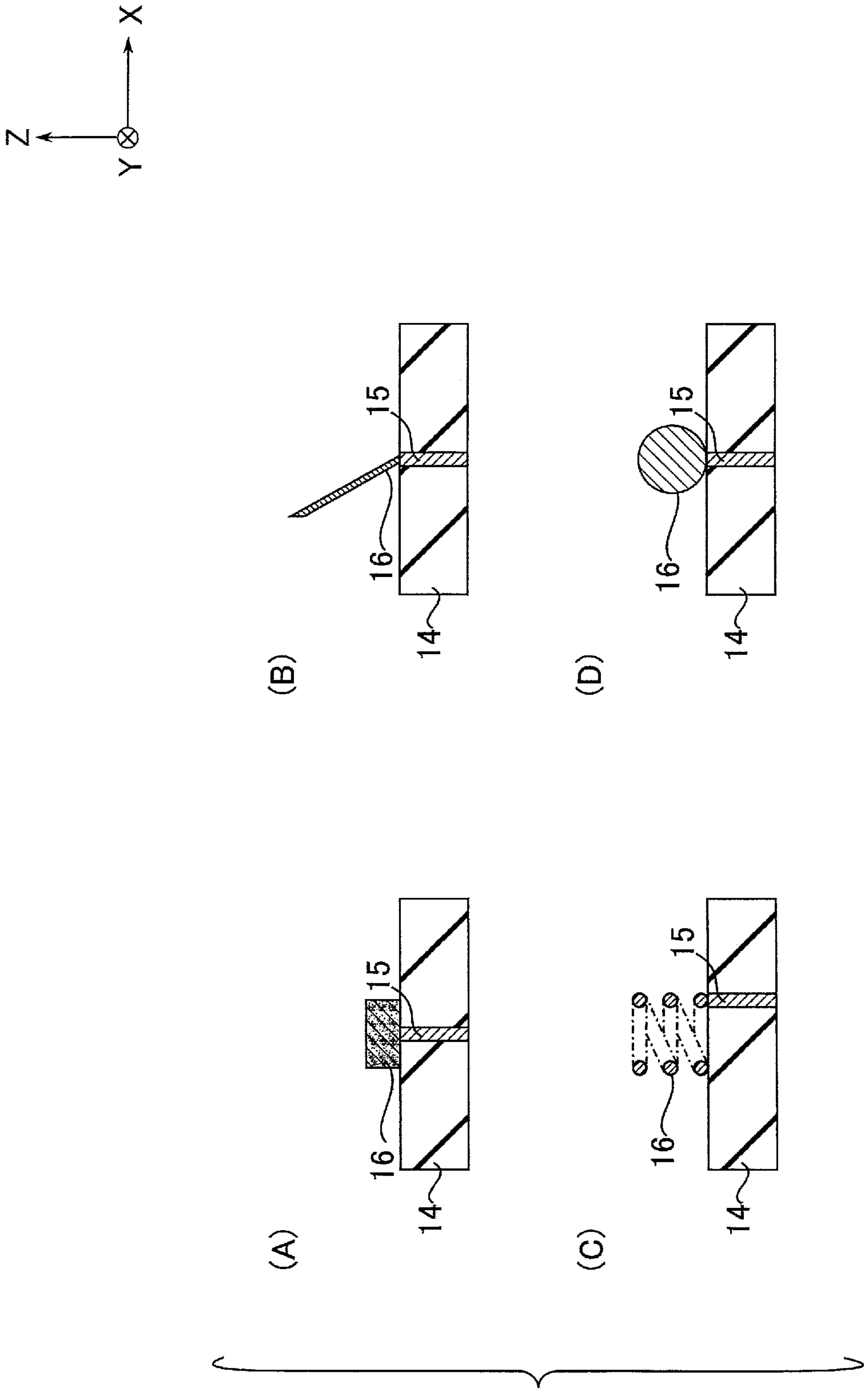
FIG. 18 is a cross-sectional view showing different exemplary configurations of electrodes that have been rearranged according to a third modification of the first embodiment.

In the above-described first embodiment and the first and second modifications of the first embodiment, the electrodes 16 containing a material of nickel (Ni) and/or gold (Au) and having a plate-like structure have been described, which is not a limitation. For instance, the electrodes 16 may contain a material other than nickel (Ni) and gold (Au). In addition, the electrodes 16 may have a structure other than the plate-like structure. Application examples of the material and structure of an electrode 16 will be described below with reference to FIGS. 18 and 19. FIG. 18 is a cross-sectional view showing different exemplary configurations of electrodes that have been rearranged according to a third modification of the first embodiment. FIG. 19 is a diagram showing the properties of the different exemplary configurations of the electrodes that have been rearranged according to the third modification of the first embodiment.

As shown in (A) of FIG. 18, the electrode 16 may have a porous structure. As shown in (B) of FIG. 18, the electrode 16 may have a wire structure. As shown in (C) of FIG. 18, the electrode 16 may have a spring structure. As shown in (D) of FIG. 18, the electrode 16 may have a ball structure.

With a porous structure, a wire structure, a spring structure, or a ball structure, the electrode 16 is configured to be elastically deformable under a load applied from the Z direction. Specifically, the electrode 16 having a porous structure, a spring structure, or a ball structure can contract under a load from the Z direction. The electrode 16 having a wire structure can be elastically bent under a load from the Z direction, where the point connected with the wiring 15 serves as a fulcrum. Thus, as shown in FIG. 19, plastic deformation of the electrode 16 can be suppressed under an overload. Furthermore, since the elastic deformation can release the stress concentrated on a specific point of the electrodes 16 to the peripheral region, the abrasion of the electrodes 16 can be suppressed.

The electrodes 16 may also contain conductive carbon, conductive rubber, or mercury (Hg). The electrodes 16 containing conductive carbon, conductive rubber, or mercury (Hg) can be easily shaped into any of the above-mentioned structures. These materials therefore may be more advantageous than others from the viewpoints of tolerance to abrasion and tolerance to plastic deformation. In addition, conductive carbon, conductive rubber, and mercury (Hg) exhibit properties of being conductive, having low contact resistance and also being less likely to be oxidized. Thus, the requirements for an electrode that electrically connects the storage wafer 10 and the probe card 20 to each other can be satisfied. The electrodes 16 with conductive rubber further exhibit properties of being less likely to be corroded and less likely to produce dust even when the electrodes 23 are prepared with a different material. For this reason, in the storage system 3 in which the touch-down process is to be conducted a plurality of times on the same storage wafer 10, the electrical characteristics can be easily maintained.

According to the third modification of the first embodiment, a structure other than a flat plate is adopted for the electrodes 16. As the material of the electrodes 16, a material other than gold (Au) and/or nickel (Ni) is adopted. Thus, even when the touch-down process is conducted on the same electrode 16 a plurality of times, the deterioration of the communication reliability can be suppressed between the storage wafer 10 and the probe card 20.

In the above-described example, changes in the structure and the material of the electrodes 16 have been discussed, which is not a limitation. For example, instead of the electrodes 16, the electrodes 23 may have a porous structure, a wire structure, a spring structure, or a ball structure. Further, the material of the electrodes 23 may contain conductive carbon, conductive rubber, or mercury (Hg). Even in this case, the same effects as the ones produced by the electrodes 16 with the changed structure and material can be produced.

2. Second Embodiment

Next, a second embodiment will be described.

According to the first embodiment, the electrodes 16A and 16B respectively arranged in the regions RA and RB on the top surface of the storage wafer have been described. The second embodiment differs from the first embodiment in that the electrodes 16A and 16B are arranged in a region on the bottom surface and a region on the top surface of the storage wafer 10, respectively. In the explanation below, descriptions of the same configurations and operations as those of the first embodiment will be omitted, and the configurations and operations that differ from those of the first embodiment will be mainly described.

2.1. Cross-Sectional Structure of Storage Wafer and Probe Card

Figure 20:
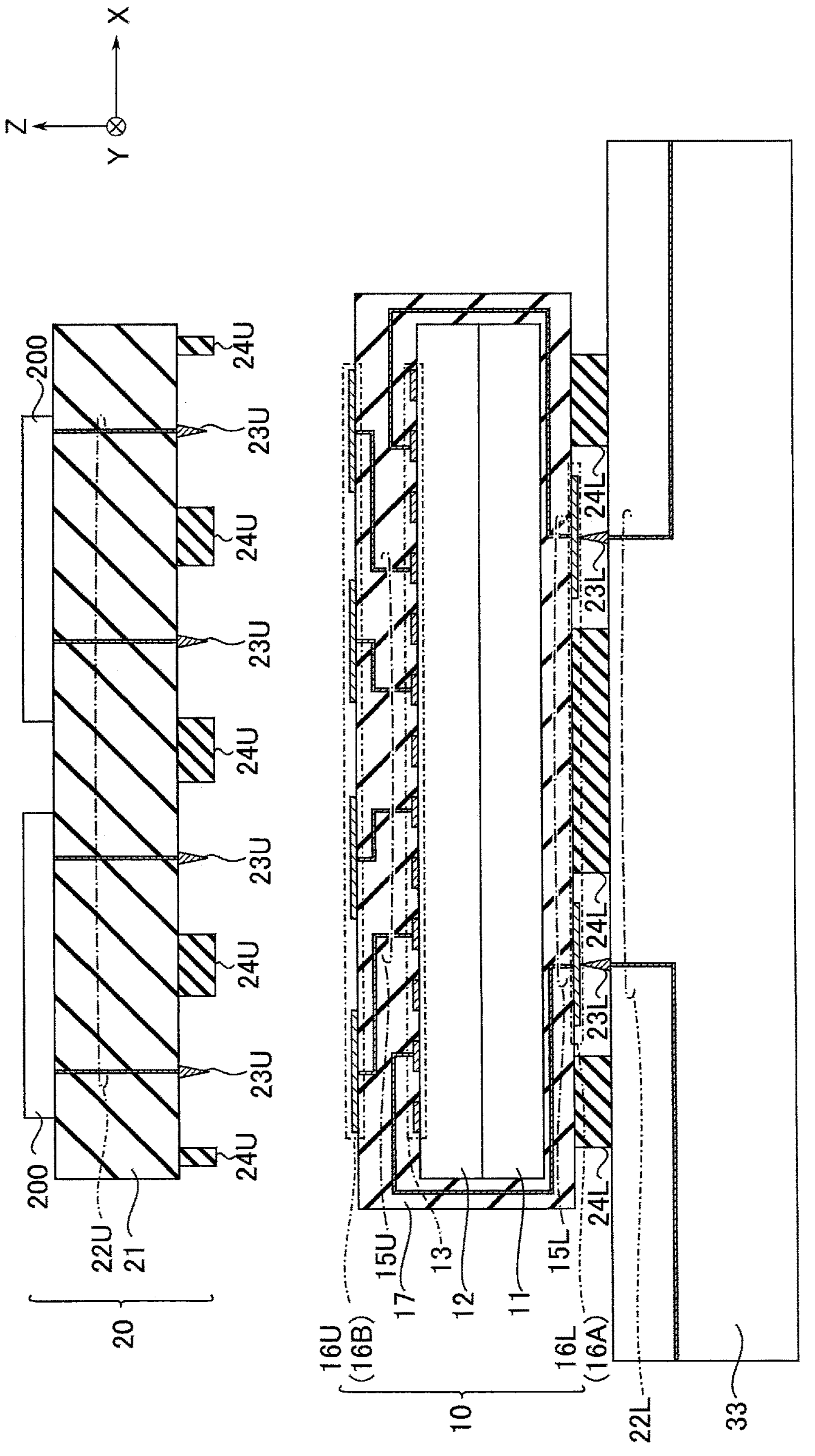
FIG. 20 is a cross-sectional view showing exemplary configurations of a storage wafer and a probe card according to a second embodiment.

FIG. 20 is a cross-sectional view showing an exemplary configuration of a storage wafer and a probe card placed in a prober according to the second embodiment. FIG. 20 corresponds to FIG. 5 for the first embodiment.

As shown in FIG. 20, the storage wafer 10 includes a substrate 11, an element layer 12, a plurality of electrodes 13, a plurality of wirings 15U and 15L, a plurality of electrodes 16U and 16L, and an insulating layer 17. In addition to the memory controller chips 200, the probe card 20 includes a substrate 21, a plurality of wirings 22U, a plurality of electrodes 23U, and an insulating layer 24U. The wafer chuck 33 includes a plurality of wirings 22L, a plurality of electrodes 23L, and an insulating layer 24L.

The configurations of the substrate 11, the element layer 12, and the electrodes 13 are the same as those of the first embodiment, and the description thereof will be omitted.

An insulating layer 17 is provided in such a manner as to cover the bottom surface and side surface of the substrate 11, the top surface and side surface of the element layer 12, and top surfaces of the electrodes 13. That is, the insulating layer 17 has a top surface located above the element layer 12 and a bottom surface located below the substrate 11. The insulating layer 17 may include polyimide.

A plurality of electrodes 16U are provided on the top surface of the insulating layer 17. The electrodes 16U are arranged in a region independent of the region in which the corresponding electrodes 13 (i.e., the corresponding memory chip units 100) are provided. The electrodes 16U correspond to the electrodes 16B. The electrodes 16U may be electrodes for signal communication. The electrodes 16U include, for example, nickel (Ni) and/or gold (Au).

A plurality of electrodes 16L are provided on the bottom surface of the insulating layer 17. The electrodes 16L are arranged in a region independent of the region where the corresponding electrodes 13 are provided. The electrodes 16L correspond to the electrodes 16A. The electrodes 16L are, for example, electrodes for voltage supply. The electrodes 16L include, for example, nickel (Ni) and/or gold (Au).

A plurality of wirings 15U are provided in the insulating layer 17 in order to electrically connect the electrodes 16U and the corresponding electrodes 13. The wirings 15U are re-wirings for rearranging some of the electrodes 13 into the electrodes 16U. Furthermore, a plurality of wirings 15L are provided in the insulating layer 17 to electrically connect the electrodes 16L and the corresponding electrodes 13. The wirings 15L are re-wirings for rearranging some of the electrodes 13 into the electrodes 16L. In the example of FIG. 20, the wirings 15U and 15L that electrically connect the electrodes 13 (shown) to the electrodes 16U and 16L (not shown) are omitted. The wirings 15U and 15L include, for example, Cu.

On the bottom surface of the substrate 21, a plurality of electrodes 23U are provided at positions corresponding to the electrodes 16U. The electrodes 23U are probe electrodes having a pin shape. A plurality of wirings 22U are provided in the substrate 21. The wirings 22U electrically connect the memory controller chips 200 and the electrodes 23U.

In addition, an insulating layer 24U is provided on the regions of the bottom surface of the substrate 21 that would not interfere with the electrodes 16U. The insulating layer 24U is configured to be in contact with the top surface of the insulating layer 17 in the touch-down process. In this manner, the insulating layer 24U has a function of distributing the stresses concentrated on the electrodes 23U and 16U. The insulating layer 24U is, for example, an insulator such as silicon oxide or polyimide.

A plurality of electrodes 23L are provided on the top surface of the wafer chuck 33 at positions corresponding to the electrodes 16L. The electrodes 23L are probe electrodes having a pin shape. A plurality of wirings 22L are provided inside the wafer chuck 33. The wirings 22L electrically connect the voltage source (not shown) and the electrodes 23L.

In addition, an insulating layer 24L is provided on the top surface of the wafer chuck 33 in a region that would not interfere with the electrodes 16L. The insulating layer 24L is configured to be in contact with the bottom surface of the insulating layer 17 in the touch-down process. In this manner, the insulating layer 24L has a function of distributing the stresses concentrated on the electrodes 23L and 16L. The insulating layer 24L is, for example, an insulator such as silicon oxide or polyimide.

2.2. Layout of Storage Wafer

Figure 21:
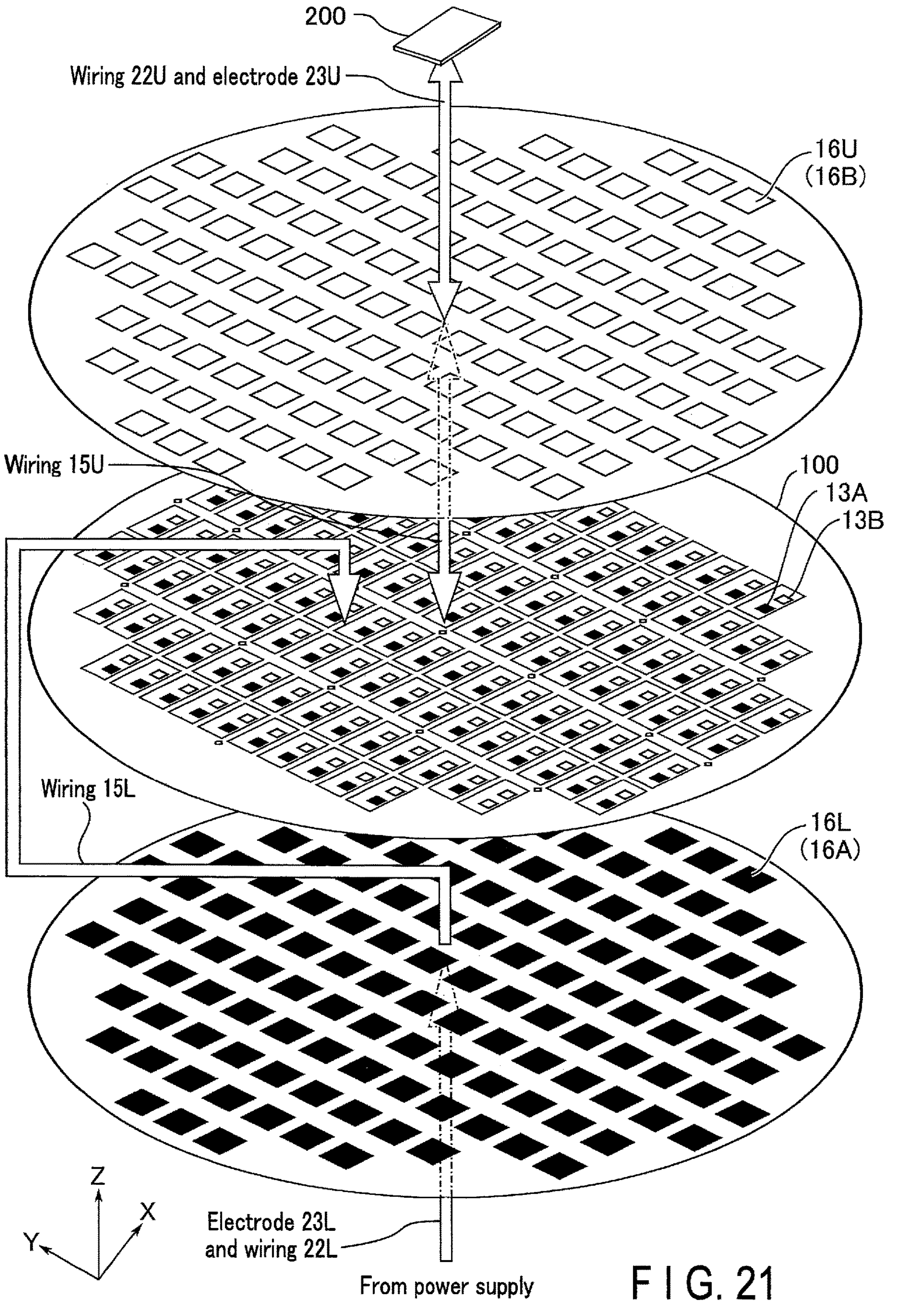
FIG. 21 is a schematic diagram illustrating electrical connection paths between the memory chip units and a memory controller chip according to the second embodiment.

Next, the layout of a storage wafer according to the second embodiment will be described. FIG. 21 is a schematic diagram showing an electrical connection path between the memory chip units and the memory controller chip according to the second embodiment.

As shown in FIG. 21, the electrodes 13B are electrically connected to the electrodes 16U via the wirings 15U extending upward in the insulating layer 17. The electrodes 13A are electrically connected to the electrodes 16L via the wirings 15L extending downward in the insulating layer 17 in such a manner as to detour around the element layer 12 and the substrate 11. Unlike the electrodes 13A and 13B, the electrodes 16L and 16U are arranged in regions independent of the region where the corresponding memory chip units 100 are provided. In particular, the electrodes 16L and 16U are arranged in a region on the bottom surface and a region on the top surface, respectively, of the storage wafer 10. The electrodes 16L are configured to be electrically connected to the voltage source via the corresponding electrodes 23L and wirings 22L. The electrodes 16U are configured to be electrically connected to the corresponding memory controller chips 200 on the probe card 20 via the corresponding electrodes 23U and wirings 22U.

With the above configuration, the electrodes 16L corresponding to the electrodes 13A and the electrodes 16U corresponding to the electrodes 13B can be arranged in two regions that do not overlap each other.

2.3. Effects According to Second Embodiment

According to the second embodiment, the insulating layer 17 covers the bottom surface and side surface of the substrate 11 and the top surface and side surface of the element layer 12. The electrodes 13A are electrically connected to the electrodes 16L via the wirings 15L provided in the insulating layer 17. The electrodes 13B are electrically connected to the electrodes 16U via the wirings 15U provided in the insulating layer 17. The electrodes 16U are provided on the top surface of the storage wafer 10. The electrodes 23U corresponding to the electrodes 16U are provided on the bottom surface of the probe card 20. The electrodes 16L are provided on the bottom surface of the storage wafer 10. The electrodes 23L corresponding to the electrodes 16L are provided on the top surface of the wafer chuck 33. With such a configuration, the electrodes 16U and electrodes 16L that have pressure thresholds different from each other can be disposed separately on different surfaces. Therefore, the pressure applied to the electrodes 16U and the pressure applied to the electrodes 16L can be easily set in such a manner as to be different from each other. In addition, the area of the surface for arranging the electrodes 16 can be ensured to be approximately twice as large as the configuration of all the electrodes 16 arranged only on one surface of the storage wafer 10. The area of the electrodes 16 therefore can be further increased, which can reduce the load during the touch-down process.

Further, the wafer chuck 33 supports a storage wafer 10 with the insulating layer 24L while bringing the electrodes 23L into contact with the electrodes 23U. The probe card 20 supports the storage wafer 10 with the insulating layer 24U, while bringing the electrodes 23U into contact with the electrodes 23L. As a result, the prober 6 can increase the contact areas between the storage wafer 10 and the wafer chuck 33 and also between the storage wafer 10 and the probe card 20. This can prevent the storage wafer 10 from being damaged by stress concentration.

2.4. Modifications of Second Embodiment

In the above second embodiment, probing is conducted on both surfaces of the storage wafer 10 with the pin-shaped electrodes 23L provided on the top surface of the wafer chuck 33, which is not a limitation. For instance, the electrodes 23L may not be pin-shaped. That is, the electrodes 23L may be electrically connected to the bottom surface of the storage wafer 10 by a method other than probing.

Figure 22:
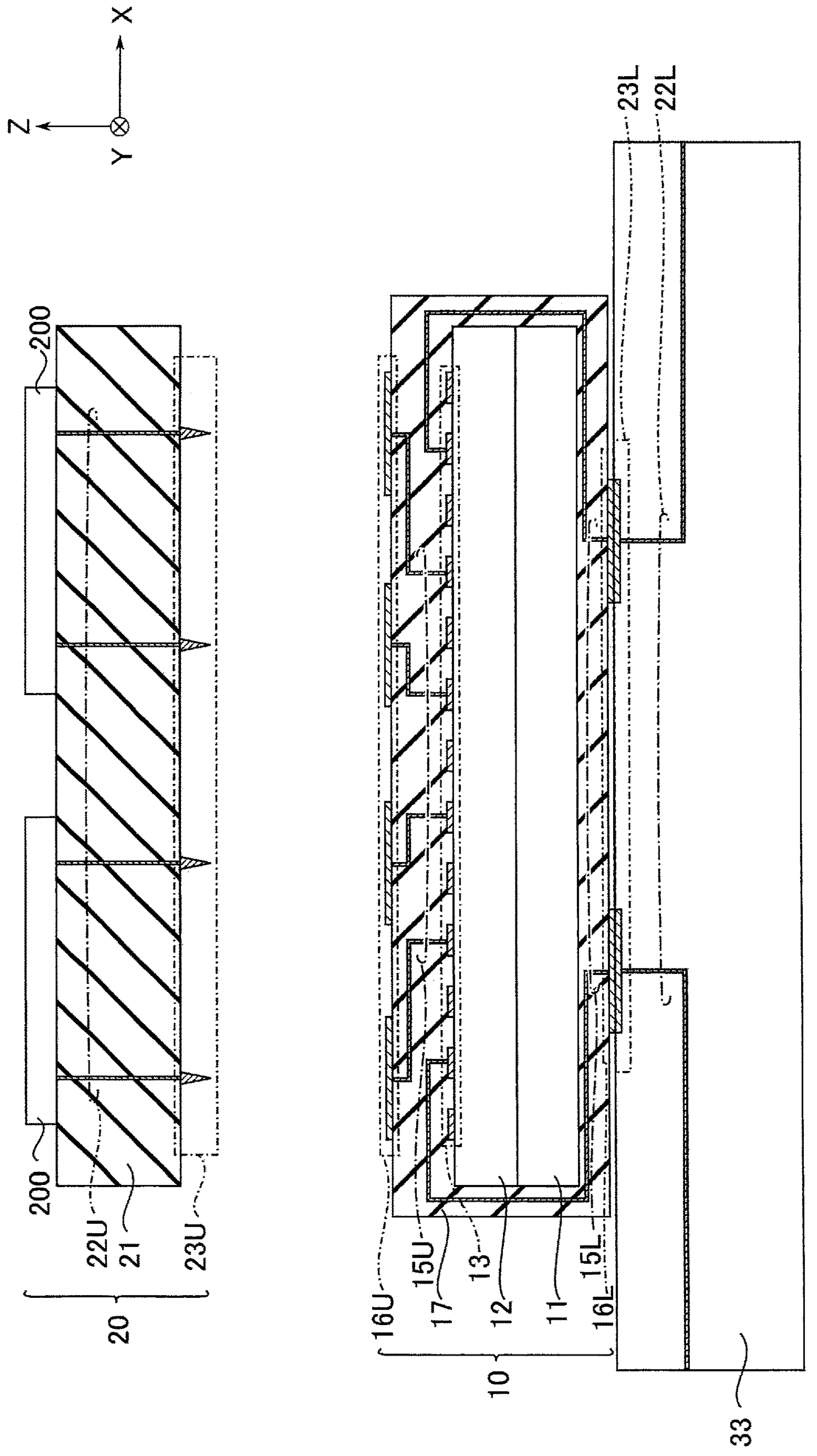
FIG. 22 is a cross-sectional view illustrating an exemplary configuration of a storage wafer and a probe card according to a modification of the second embodiment.

FIG. 22 is a cross-sectional view showing an exemplary configuration of the storage wafer and the probe card placed in the prober according to a modification of the second embodiment. FIG. 22 corresponds to FIG. 20 for the second embodiment. As shown in FIG. 22, the configuration of the storage wafer 10 is the same as that of the second embodiment, and the description thereof will be omitted. Furthermore, the configuration of the probe card 20 is the same as that of the second embodiment, except that the insulating layer 24U is not provided.

A plurality of wirings 22L for electrically connecting the voltage source (not shown) and the electrodes 23L are provided in the wafer chuck 33. A plurality of electrodes 23L are provided on the top surface of the wafer chuck 33 at positions corresponding to the electrodes 16L. The electrodes 23L are used for voltage supply. The electrodes 23L may be metallic plates.

In the example of FIG. 22, the electrodes 23L that are metal plates have been described, which is not a limitation. For instance, the electrodes 23L may have a ball structure. Alternatively, the electrodes 23L may have a clip structure that physically clips each of the electrodes 16L. If the electrodes 23L are provided with this clip structure, the electrodes 16L may be shaped in such a manner as to protrude from the outer edge of the storage wafer 10 so that the electrodes 23L can easily hold the electrodes 16L.

With the above configuration, the storage wafer comes into contact with the wafer chuck 33 in an increased area. It is therefore possible to suppress an overload on the electrodes 23L and 16L without requiring an insulating layer 24L on the top surface of the wafer chuck 33. This can reduce a manufacturing load for suppressing breakage of the electrodes 23L and 16L.

3. Third Embodiment

Next, a third embodiment will be described.

The third embodiment is the same as the second embodiment in the arrangement of the electrodes in both a region on the bottom surface and a region on the top surface of the storage wafer 10. The third embodiment, however, differs from the second embodiment in that the electrodes in the region on the bottom surface of the storage wafer 10 and the memory chip units 100 are electrically connected to each other by using the wirings provided inside the substrate 11 and the element layer 12. In the explanation below, descriptions of the same configurations and operations as those of the second embodiment will be omitted, and the configurations and operations different from those of the second embodiment will be mainly described.

3.1. Cross-Sectional Structure of Storage Wafer and Probe Card

Figure 23:
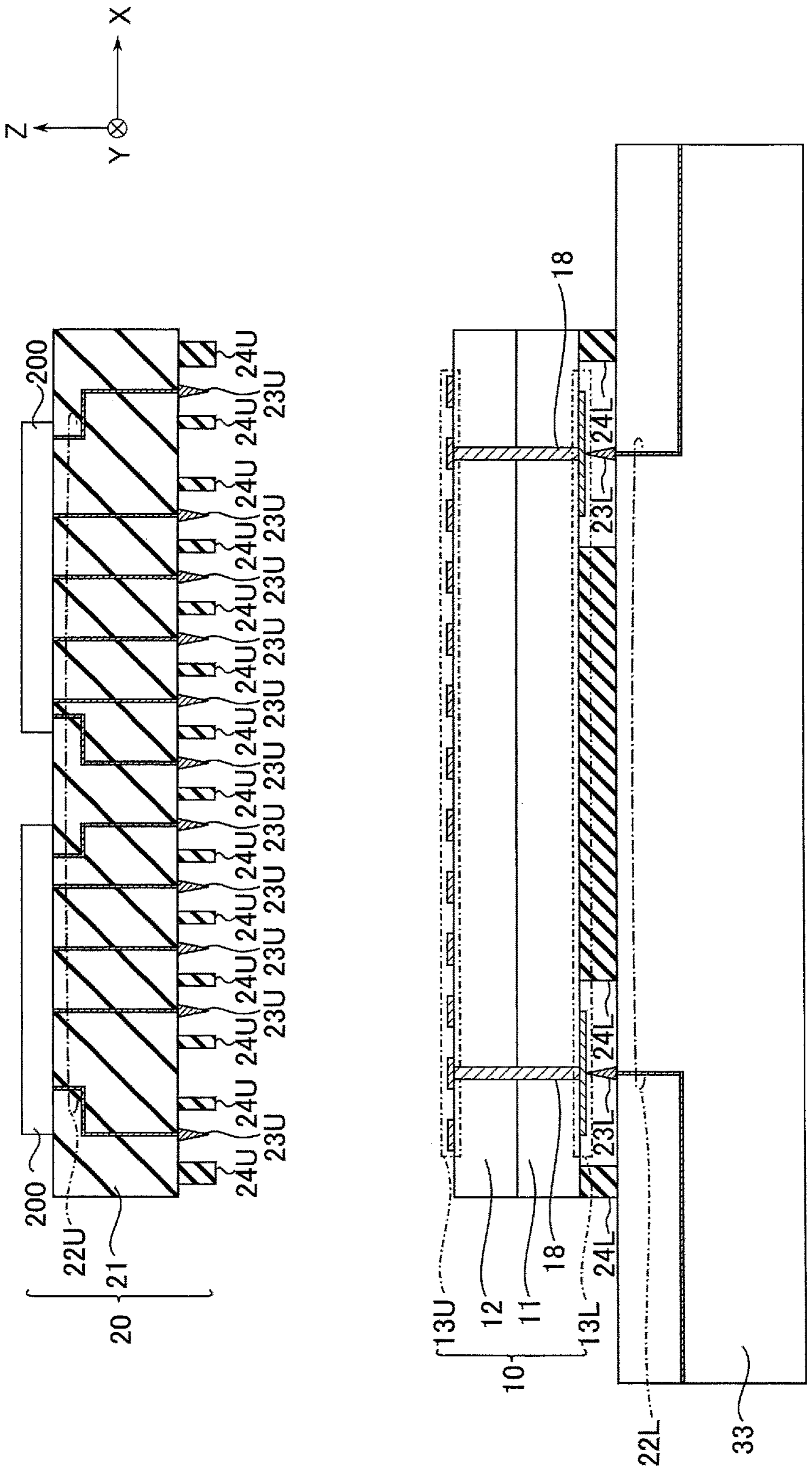
FIG. 23 is a cross-sectional view illustrating an exemplary configuration of a storage wafer and a probe card according to a third embodiment.

FIG. 23 is a cross-sectional view showing an exemplary configuration of the storage wafer and the probe card placed in the prober according to the third embodiment. FIG. 23 corresponds to FIG. 20 for the second embodiment.

As shown in FIG. 23, the storage wafer 10 includes a substrate 11, an element layer 12, a plurality of electrodes 13U and 13L, and a plurality of wirings 18. In addition to the memory controller chips 200, the probe card 20 includes a substrate 21, a plurality of wirings 22U, a plurality of electrodes 23U, and an insulating layer 24U. The wafer chuck 33 includes a plurality of wirings 22L, a plurality of electrodes 23L, and an insulating layer 24L.

The configurations of the substrate 11 and the element layer 12 are the same as those in the second embodiment, and the description thereof will be omitted.

A plurality of electrodes 13U are provided on the top surface of the element layer 12. Each of the electrodes 13U is provided directly above the corresponding memory chip unit 100. The electrodes 13U correspond to the electrodes 13A and 13B. The electrodes 13U may include aluminum (Al).

A plurality of electrodes 13L are provided on the bottom surface of the substrate 11. The electrodes 13L are arranged in a region independent of the region where the corresponding memory chip units 100 are provided. The electrodes 13L correspond to the electrodes 13A. The electrodes 13L may include nickel (Ni) and/or gold (Au).

In the element layer 12 and the substrate 11, a plurality of wirings 18 are provided to electrically connect a portion of the electrodes 13U corresponding to the electrodes 13A with the electrodes 13L. In the example of FIG. 23, the wirings 18 electrically connecting the electrodes 13U that are shown and the electrodes 13L that are not shown are omitted. The wirings 18 may include copper (Cu).

The probe card 20 and the wafer chuck 33 have the same configurations as those of the second embodiment, and the description thereof will be omitted.

In the example of FIG. 23, the electrodes 13U corresponding to the electrodes 13A and 13B have been described, which is not a limitation. For example, the electrodes 13U will suffice if they include at least a portion corresponding to the electrodes 13B, and the electrodes 13U may not necessarily include a portion corresponding to the electrodes 13A. If the electrodes 13U do not include a portion corresponding to the electrodes 13A, the wirings 18 may electrically connect the electrodes 13L and the circuit in the memory chip unit 100.

3.2. Layout of Storage Wafer

Figure 24:
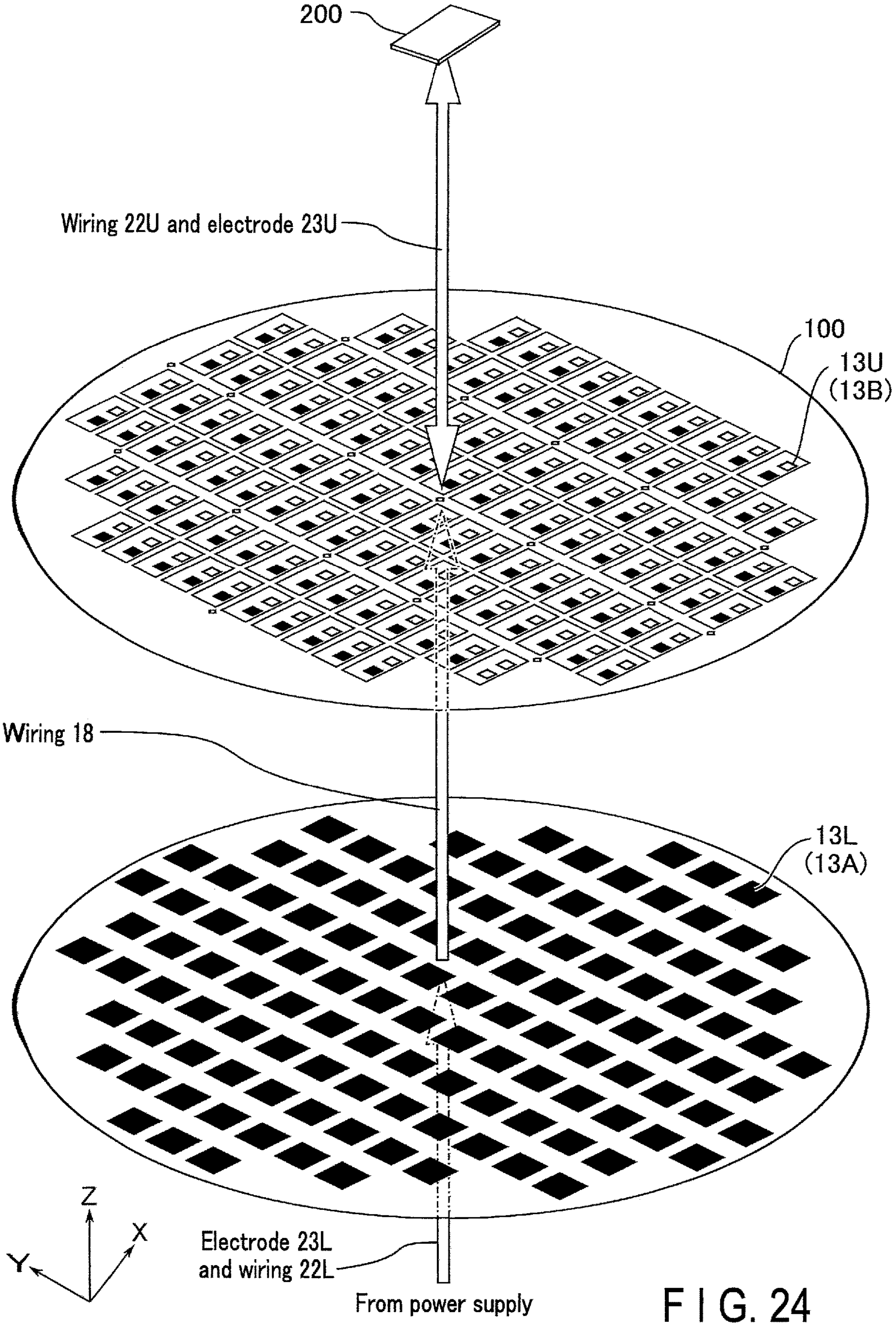
FIG. 24 is a schematic diagram illustrating electrical connection paths between the memory chip units and a memory controller chip according to the third embodiment.

Next, the layout of the storage wafer according to the third embodiment will be described. FIG. 24 is a schematic diagram showing an electrical connection path between the memory chip units and the memory controller chip according to the third embodiment.

As shown in FIG. 24, the electrodes 13A are electrically connected to the electrodes 13L via the wirings 18 extending downward in the element layer 12 and the substrate 11. Unlike the electrodes 13U, the electrodes 13L are arranged in a region independent of the region where the corresponding memory chip units 100 are provided. In particular, the electrodes 13L are arranged in a region on the bottom surface of the storage wafer 10. The electrodes 13L are electrically connected to the voltage source via the corresponding electrodes 23L and wirings 22L. The electrodes 13U corresponding to the electrodes 13B are electrically connected to the corresponding memory controller chips 200 on the probe card 20 via the corresponding electrodes 23U and wirings 22U.

With the above configuration, the electrodes 13U corresponding to the electrodes 13A and the electrodes 13L corresponding to the electrodes 13B can be arranged in two regions that do not overlap each other.

3.3. Effects According to Third Embodiment

According to the third embodiment, the electrodes 13U correspond to the electrodes 13A and 13B. A portion of the electrodes 13U corresponding to the electrodes 13B is electrically connected to the electrodes 13L via the wirings 18 provided in the substrate 11 and the element layer 12. The electrodes 13L are provided on the bottom surface of the storage wafer 10. The electrodes 23L corresponding to the electrodes 13L are provided on the top surface of the wafer chuck 33. With this configuration, the electrodes 13U and electrodes 13L that have mutually different pressure thresholds can be arranged separately on different surfaces. Therefore, the pressure applied to the electrodes 13U and the pressure applied to the electrodes 13L can be easily set so as to be different from each other. In addition, the area of the surface for arranging the electrodes 13 can be ensured to be approximately twice as large as the configuration of all the electrodes 13 arranged only on one surface of the storage wafer 10. The area for the electrodes 13 (electrodes 13L in particular) can be further increased, and the load of the touch-down process can be reduced.

Further, the wafer chuck 33 supports a storage wafer 10 with the insulating layer 24L while bringing the electrodes 23L into contact with the electrodes 23U. The probe card 20 supports the storage wafer 10 with the insulating layer 24U while bringing the electrodes 23U into contact with the electrodes 23L. As a result, the prober 6 can increase the contact areas between the storage wafer 10 and the wafer chuck 33 and also between the storage wafer 10 and the probe card 20. This can prevent the storage wafer 10 from being damaged by stress concentration.

The wirings 18 are provided in the substrate 11 and the element layer 12. The wirings 18 therefore can be formed at the step of forming the substrate 11 and element layer 12. Thus, the manufacturing process can be simplified as compared to the case where the wirings 18 are formed at a step different from the step of forming the substrate 11 and the element layer 12.

3.4. Modifications of Third Embodiment

In the description of the above third embodiment, probing is conducted on both surfaces of the storage wafer 10 with the pin-shaped electrodes 23L provided on the top surface of the wafer chuck 33, which is not a limitation. For instance, the electrodes 23L may not be pin-shaped. That is, the electrodes 23L may be electrically connected to the bottom surface of the storage wafer 10 by a method other than probing.

Figure 25:
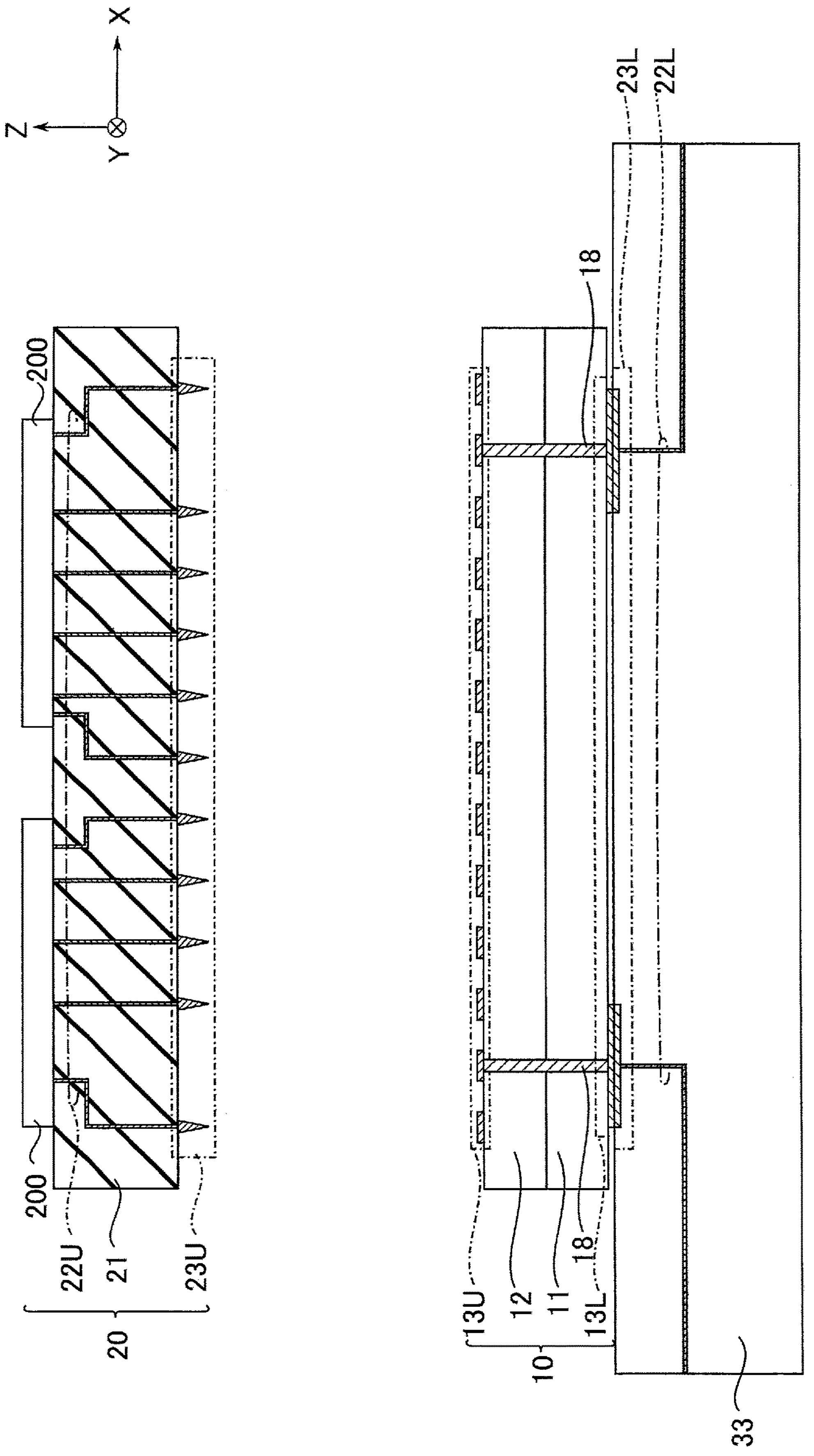
FIG. 25 is a cross-sectional view illustrating an exemplary configuration of a storage wafer and a probe card according to a modification of the third embodiment.

FIG. 25 is a cross-sectional view showing an exemplary configuration of a storage wafer and the probe card placed in the prober according to a modification of the third embodiment. FIG. 25 corresponds to FIG. 23 for the third embodiment. The configuration of the storage wafer 10 is the same as that of the third embodiment as shown in FIG. 25, and the description thereof will be omitted. Furthermore, the configuration of the probe card is the same as that of the third embodiment, except that the insulating layer 24U is not provided.

A plurality of wirings 22L are provided in the wafer chuck 33 to electrically connect the voltage source (not shown) and the electrodes 23L. A plurality of electrodes 23L are provided on the top surface of the wafer chuck 33 at positions corresponding to the electrodes 16L. The electrodes 23L are used for voltage supply. The electrodes 23L may be metallic plates.

In the example of FIG. 25, the electrodes 23L that are metal plates have been described, which is not a limitation. For instance, the electrodes 23L may have a ball structure. Alternatively, the electrodes 23L may have a clip structure that physically clips each of the electrodes 16L. When the electrodes 23L have this clip structure, the electrodes 16L may be shaped in such a manner as to protrude from the outer edge of the storage wafer 10 so that the electrodes 23L can be easily held.

With the above configuration, the storage wafer comes into contact with the wafer chuck 33 in an increased area. It is therefore possible to suppress an overload on the electrodes 23L and 16L without requiring an insulating layer 24L on the top surface of the wafer chuck 33. Thus, a manufacturing load for suppressing breakage of the electrodes 23L and 16L can be reduced.

4. Fourth Embodiment

Next, a fourth embodiment will be described.

In the fourth embodiment, a probe card 20 further having a function of dissipating the heat of the storage wafer 10 will be described. In the explanation below, the descriptions of the same configurations and operations as those of the first embodiment will be omitted, and the configurations and operations different from those of the first embodiment will be mainly described.

4.1. Cross-Sectional Structure of Storage Wafer and Probe Card

Figure 26:
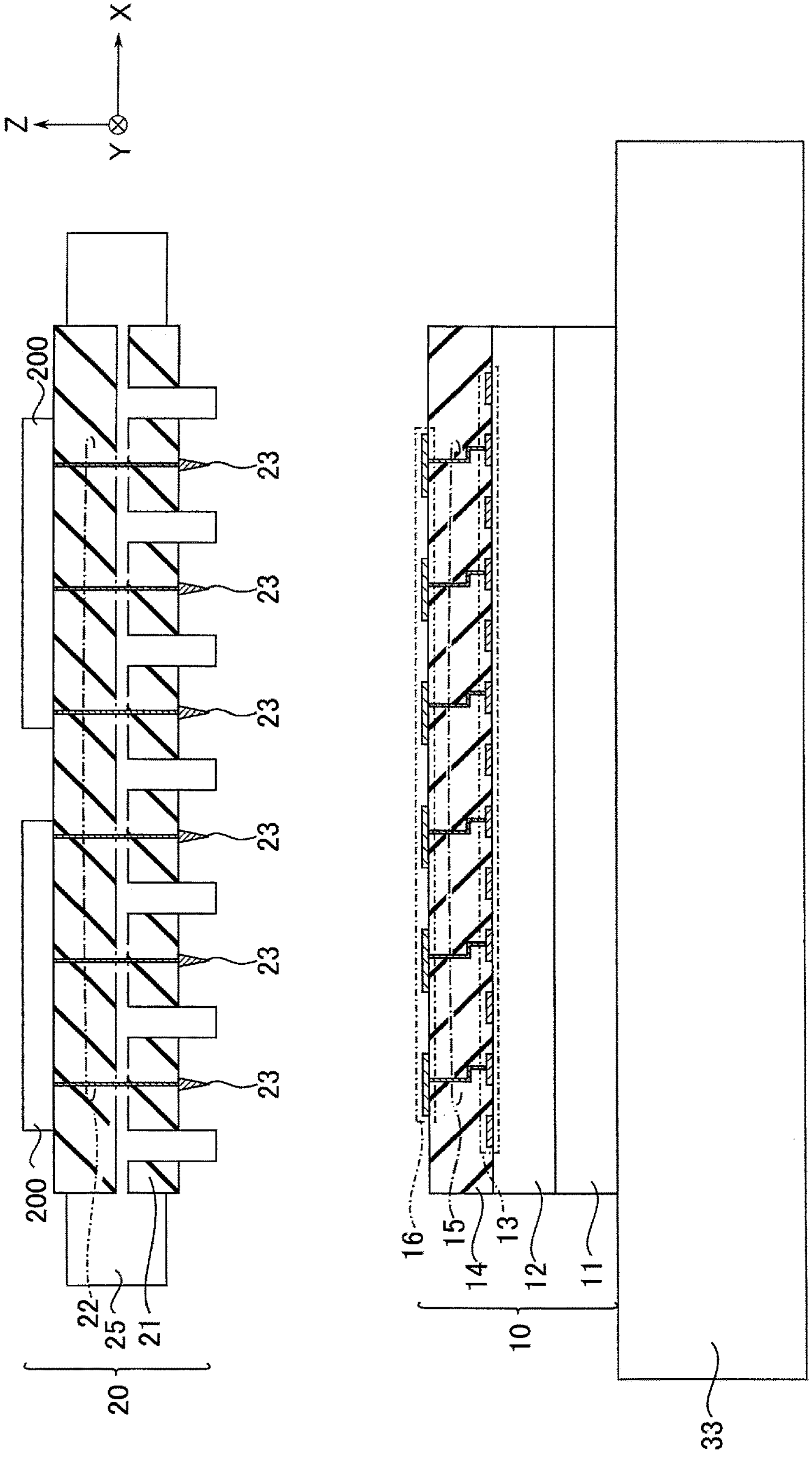
FIG. 26 is a cross-sectional view illustrating an exemplary configuration of a storage wafer and a probe card according to a fourth embodiment.

FIG. 26 is a cross-sectional view showing an exemplary configuration of the storage wafer and the probe card placed in the prober according to the fourth embodiment. FIG. 26 corresponds to FIG. 5 for the first embodiment.

As shown in FIG. 26, the configuration of the storage wafer 10 is the same as that of the first embodiment, and the description thereof will be omitted. In addition to the memory controller chips 200, the probe card 20 includes a substrate 21, a plurality of wirings 22U, a plurality of electrodes 23U, and a heat dissipation mechanism 25. The configurations of the substrate 21, the wirings 22 and the electrodes 23 are the same as those in the first embodiment, and the description thereof will be omitted. The heat dissipation mechanism 25 includes a plurality of first portions, a second portion, and a third portion connecting the first portions and the second portion.

The first portions of the heat dissipation mechanism 25 are provided in a region of the bottom surface of the substrate 21 that does not interfere with the electrodes 16. The first portions of the heat dissipation mechanism 25 are configured to come into contact with the insulating layer 14 in the touch-down process. The first portions of the heat dissipation mechanism 25 therefore can absorb the heat of the storage wafer 10 while distributing the stress concentration on the electrodes 23 and 16. It is preferable that an insulator material having a high thermal conductivity be adopted for the first portions of the heat dissipation mechanism 25.

The third portion of the heat dissipation mechanism 25 is connected to the first portions of the heat dissipation mechanism 25 in the substrate 21. The third portion of the heat dissipation mechanism 25 has a function of conducting the heat absorbed by the first portions of the heat dissipation mechanism 25 to the second portion of the heat dissipation mechanism 25. It is preferable that the third portion of the thermal conductivity of the heat dissipation mechanism 25 be equal to or higher than that of the first portions of the heat dissipation mechanism 25. The third portion of the heat dissipation mechanism 25 may be prepared from the same material as the first portions of the heat dissipation mechanism 25. The third portion of the heat dissipation mechanism 25 may be a conductor such as a metal. If the third portion of the heat dissipation mechanism 25 is a conductor, an insulator (not shown) will be provided between the wirings 22 and the third portion of the heat dissipation mechanism 25.

The second portion of the heat dissipation mechanism 25 is connected to the third portion of the heat dissipation mechanism 25 on the side of the substrate 21. The second portion of the heat dissipation mechanism 25 has a function of dissipating the heat from the third portion of the heat dissipation mechanism 25 to the outside of the probe card 20. In particular, the second portion of the heat dissipation mechanism 25 may have a corrugated structure so that its surface area can be increased. The second portion of the heat dissipation mechanism 25 may be a heat sink, a heat pipe, a radiator, or a Peltier element. It is preferable that the thermal conductivity of the second portion of the heat dissipation mechanism 25 be equal to or higher than that of the third portion of the heat dissipation mechanism 25. The second portion of the heat dissipation mechanism 25 may be prepared of the same material as the third portion of the heat dissipation mechanism 25. The second portion of the heat dissipation mechanism 25 may be a conductor such as a metal.

4.2. Effects According to Fourth Embodiment

Figure 27:
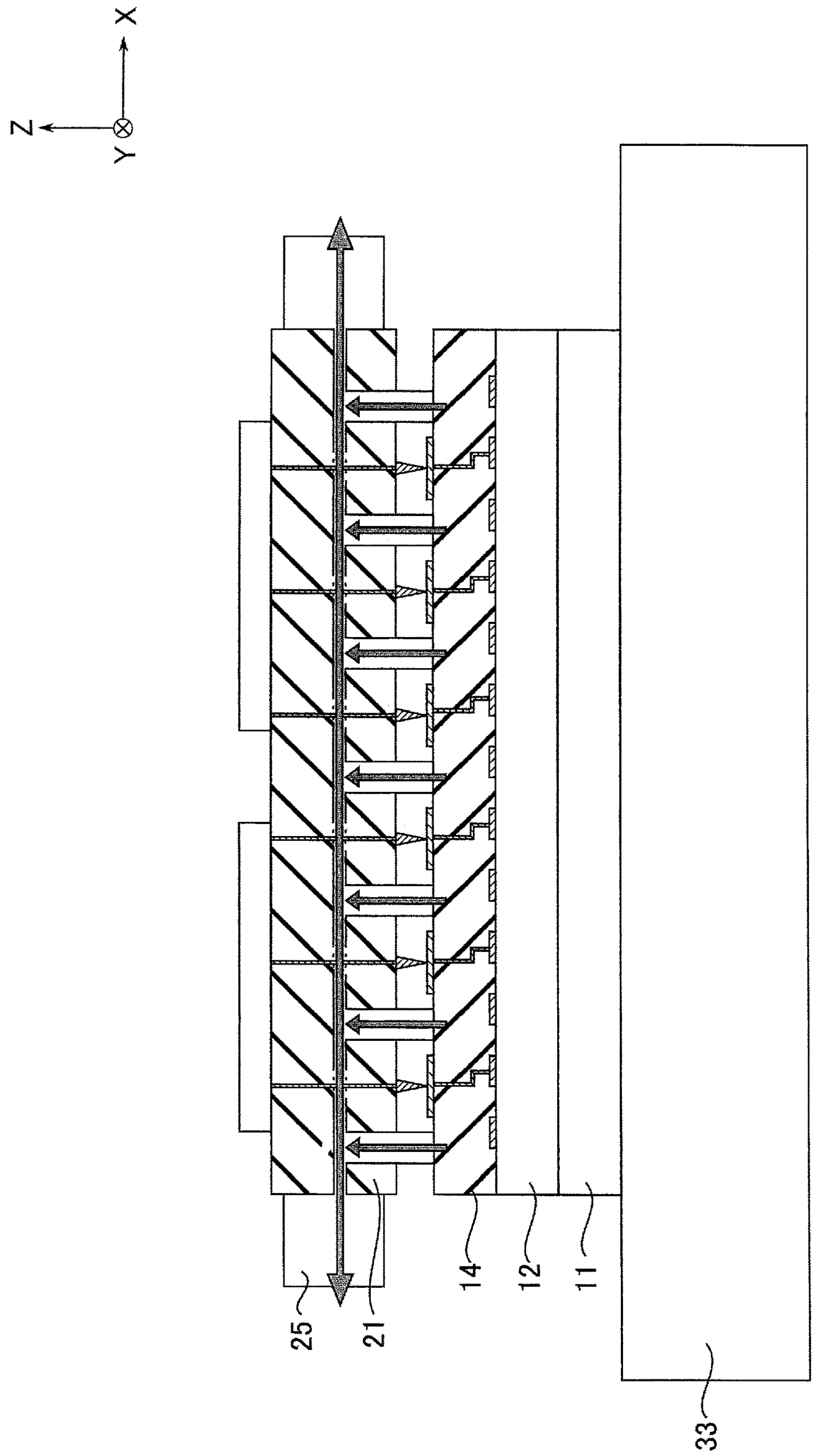
FIG. 27 is a schematic view showing an exemplary heat dissipating operation in the storage wafer and the probe card according to the fourth embodiment.

The effects according to the fourth embodiment will be described with reference to FIG. 27. The schematic diagram of FIG. 27 shows an exemplary heat dissipating operation in the storage system according to the fourth embodiment.

The write and read characteristics of the memory cells in the storage wafer 10 may vary in accordance with temperature. For this reason, it is preferable from the viewpoint of enhancement of the reliability of the data stored in the storage wafer 10 that the temperature of the storage wafer 10 be kept constant. It is also preferable from the viewpoint of prevention of a misalignment between the electrodes due to expansion and contraction caused by a temperature change that the temperature of the entire system including the storage wafer 10 and the probe card be uniformly maintained.

According to the fourth embodiment, the probe card 20 includes a heat dissipation mechanism 25. The heat dissipation mechanism 25 includes a plurality of first portions provided in a region not interfering with the electrodes 16 on the bottom surface of the substrate 21, a second portion provided on a side of the substrate 21, and a third portion provided in the substrate 21 and connecting the first portions and the second portion. As shown in FIG. 27, the first portions of the heat dissipation mechanism 25 are configured to come into contact with the top surface of the storage wafer 10 in the touch-down process. Thus, the heat generated in the storage wafer 10 can be released to the outside via the wafer chuck 33, and can also be released to the side of the probe card 20 by way of the heat dissipation mechanism 25. It is therefore possible not only to suppress the temperature rise in the storage wafer 10 that is being operated, but also to keep the temperature of the entire system including the storage wafer 10 and the probe card uniform.

5. Others

In the first to fourth embodiments and their various modifications described above, the drive control system 8 configured to move the storage wafer 10 with respect to the fixed probe card 20 has been described, which is not a limitation. For instance, the drive control system 8 may be configured to move the probe card 20 with respect to the fixed storage wafer 10. The drive control system 8 may be configured to move both the storage wafer and the probe card 20.

In the above-described first to fourth embodiments and various modification examples, the memory chip units 100 being a NAND flash memory has been described, which is not a limitation. For instance, the memory chip unit 100 may be a non-volatile memory other than a NAND flash memory. For instance, the memory chip unit 100 may be a NOR flash memory or an electrically erasable programmable read only memory (EEPROM™).

In the above-described first to fourth embodiments and their various modifications, a storage wafer including a plurality of memory chip units is placed in the prober 6, which is not a limitation. For instance, a wafer including a plurality of chip units each having a function other than a memory may be placed in the prober 6.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A wafer comprising:

a substrate;

an element layer provided on the substrate;

a first insulating layer provided to cover the element layer and including a first region and a second region that do not overlap each other in a plan view;

a first chip unit and a second chip unit each provided in the element layer, each of the first chip unit and the second chip unit including a memory cell configured to store data in a non-volatile manner;

a first electrode and a second electrode each electrically connected to the first chip unit; and a third electrode and a fourth electrode each electrically connected to the second chip unit, wherein the first chip unit includes a fifth electrode electrically connected to the first electrode, the first chip unit includes a sixth electrode electrically connected to the second electrode, the second chip unit includes a seventh electrode electrically connected to the third electrode, the second chip unit includes an eighth electrode electrically connected to the fourth electrode, the first electrode and the third electrode are arranged in the first region, the second electrode and the fourth electrode are arranged in the second region, first write data transmitted from a host is capable of being transferred through the second electrode and the sixth electrode to be stored in the memory cell of the first chip unit, second write data transmitted from the host is capable of being transferred through the fourth electrode and the eighth electrode to be stored in the memory cell of the second chip unit, and the second region, in which the second electrode and the fourth electrode are arranged, is, in the plan view, independent of a region in which the first chip unit and the second chip unit are provided.

2. The wafer according to claim 1, wherein the first region and the second region are included in a region of the first insulating layer viewed from a first surface side of the substrate.

3. The wafer according to claim 2, wherein the first insulating layer is arranged between (i) the first electrode, the second electrode, the third electrode, and the fourth electrode and (ii) the fifth electrode, the sixth electrode, the seventh electrode, and the eighth electrode, wherein the first insulating layer contains polyimide.

4. The wafer according to claim 1, wherein the first region is included in a region of the first insulating layer viewed from a first surface side of the substrate, and the second region is included in a region of the first insulating layer viewed from a second surface side of the substrate opposing the first surface.

5. The wafer according to claim 4, further comprising:

a second insulating layer including a first portion arranged between (i) the first electrode and the third electrode and (ii) the substrate, a second portion arranged between (iii) the second electrode and the fourth electrode and (iv) the fifth electrode, the sixth electrode, the seventh electrode, and the eighth electrode, and a third portion arranged on a side surface of the substrate and connecting the first portion and the second portion to each other, wherein the second insulating layer contains polyimide.

6. The wafer according to claim 1, wherein the first electrode, the second electrode, the third electrode, and the fourth electrode each contains conductive carbon, conductive rubber, or mercury.

7. The wafer according to claim 1, wherein the first electrode, the second electrode, the third electrode, and the fourth electrode each has a plate structure, a wire structure, a ball structure, a spring structure, or a porous structure.

8. The wafer according to claim 1, wherein the first electrode and the third electrode are for electric power supply, and the second electrode and the fourth electrode are for signal communication.

9. The wafer according to claim 1, wherein an area of the first electrode is larger than an area of the fifth electrode, an area of the second electrode is larger than an area of the sixth electrode, an area of the third electrode is larger than an area of the seventh electrode, and an area of the fourth electrode is larger than an area of the eighth electrode.

10. The wafer according to claim 1, wherein a pressure threshold of the first electrode is higher than a pressure threshold of the second electrode, and a pressure threshold of the third electrode is higher than a pressure threshold of the fourth electrode.

11. The wafer according to claim 1, wherein the first region, in which the first electrode and the third electrode are arranged, is, in the plan view, independent of the region in which the first chip unit and the second chip unit are provided.

12. The wafer according to claim 1, wherein the first region and the second region are concentric on the wafer, the second region, in which the second electrode and the fourth electrode are arranged, includes, in the plan view, a center of the wafer, and the first region, in which the first electrode and the third electrode are arranged, is, in the plan view, located outside the second region with respect to the center of the wafer.

* * * * *